(12) United States Patent
Abushama

(10) Patent No.: US 9,136,423 B1
(45) Date of Patent: Sep. 15, 2015

(54) METHOD AND APPARATUS FOR DEPOSITING COPPER—INDIUMGALLIUMSELENIDE (CUINGASE2-CIGS) THIN FILMS AND OTHER MATERIALS ON A SUBSTRATE

(71) Applicant: Jehad A. Abushama, San Jose, CA (US)

(72) Inventor: Jehad A. Abushama, San Jose, CA (US)

( * ) Notice: Subject to any disclaimer, the term of this patent is extended or adjusted under 35 U.S.C. 154(b) by 33 days.

(21) Appl. No.: 14/214,665

(22) Filed: Mar. 15, 2014

(51) Int. Cl.
*H01L 31/18* (2006.01)
*H01L 31/032* (2006.01)

(52) U.S. Cl.
CPC ............ *H01L 31/18* (2013.01); *H01L 31/0322* (2013.01)

(58) Field of Classification Search
CPC ................. H01L 31/0322; H01L 31/1872
See application file for complete search history.

(56) References Cited

U.S. PATENT DOCUMENTS

| | | | |
|---|---|---|---|
| 8,425,739 B1* | 4/2013 | Wieting | 204/192.26 |
| 8,465,589 B1* | 6/2013 | Nath et al. | 118/715 |
| 8,907,253 B2* | 12/2014 | Koetschau et al. | 219/411 |
| 2011/0223745 A1* | 9/2011 | Wieting | 438/478 |
| 2012/0034764 A1* | 2/2012 | Sferlazzo et al. | 438/479 |
| 2013/0153414 A1* | 6/2013 | Endo et al. | 204/298.13 |

* cited by examiner

*Primary Examiner* — Yu-Hsi D Sun
*Assistant Examiner* — Ankush Singal

(57) ABSTRACT

A method to deposit CIGS thin film for solar panel construction comprising: providing a first chamber; providing a substrate and placing said substrate inside said first chamber; providing a metallic target wherein said metallic target is made with elements and/or compounds selected from the group consisting of Cu, CuGa, In, CuIn and CuInGa; placing said metallic target inside said first chamber; reducing pressure within said first chamber to a pressure of less than $1 \times 10^{-6}$ Torr; adding sputtering gas into said first chamber after reducing pressure within said first chamber to a pressure of less than $1 \times 10^{-6}$ Torr until said pressure in said chamber is increased to about 100 mTorr or less, sputtering said elements and/or compounds from said metallic target to said substrate; providing a second chamber; transferring said substrate from said first chamber to said second chamber after said substrate is sputtered with said elements; proving a Se vapor into said second chamber; perform vapor deposition as to allow said Se to be deposited on said substrate. In one aspect, Cu is sputtered onto a back contact coated substrate in said first chamber, then the Cu coated substrate is transferred to a second chamber kept under reduced pressure of less than $1 \times 10^{-6}$ Torr where it gets heated to the CIGS crystallization temperature at the same time while delivering In, Ga and Se vapors onto said heated and Cu-coated substrate to form CIGS. Said In, Ga and Se vapors can be produced using thermal evaporation, Vapor Transport Deposition (VTD); and/or Close Space Sublimation (CSS).

31 Claims, 10 Drawing Sheets

METHOD AND APPARATUS FOR DEPOSITING COPPER—INDIUMGALLIUMSELENIDE (CUINGASE2-CIGS) THIN FILMS AND OTHER MATERIALS ON A SUBSTRATE

INCORPORATION BY REFERENCE

This is a continuation in part application to application Ser. No. 14/183,465 "METHOD AND APPARATUS FOR DEPOSITING COPPER-INDIUM-GALLIUM SELENIDE (CuInGaSe2-CIGS) THIN FILMS AND OTHER MATERIALS ON A SUBSTRATE" which was filed on Feb. 18, 2014, which claims the priority under 35 U.S.C. 119(e) to the filing date of U.S. provisional patent application No. 61/793,240 titled "METHOD AND APPARATUS FOR DEPOSITING COPPER-INDIUM-GALLIUM-SELENIDE (CuInGaSe2-CIGS) THIN FILMS AND OTHER MATERIALS ON A SUBSTRATE" which was filed on Mar. 15, 2013, and which are incorporated herein by reference in its entirety.

FIELD OF THE INVENTION

The present invention relates to a thin film solar cell, and more particularly to a method of manufacturing a Copper-Indium-Gallium-Selenide (CIGS) thin films and other materials on a substrate.

BACKGROUND OF THE INVENTION

The present invention relates generally to photovoltaic techniques. More particularly, the present invention provides a method and structure for a thin-film photovoltaic device using Copper-Indium-Gallium-Selenide, and other materials. In general, solar cells are photovoltaic devices that convert sunlight directly into electrical power. The most common solar cell material is Silicon (Si), which is in the form of single or polycrystalline wafers. However, because the cost of electricity generated using silicon-based solar cells is higher than the cost of electricity generated by the more traditional methods, a method to reduce the cost of solar cells is desirable. One way of reducing the cost of solar cells is to develop low-cost thin film growth techniques that can deposit solar-cell-quality absorber materials on large area substrates and to fabricate these devices using high-throughput, low-cost methods. A thin-film solar cell (TFSC), which is also known as thin film photovoltaic cell (TFPV), is a solar cell that is made by depositing one or more thin layers of photovoltaic material on a substrate.

In general, solar cells are classified into various types according to a material of a light-absorbing layer. Solar cells may be categorized into silicon solar cells having silicon as a light-absorbing layer, compound thin film solar cells using CIS (CuInSe2) or CdTe, III-V group solar cells, dye-sensitized solar cells, and organic solar cells.

Among the solar cells, silicon solar cells include crystalline solar cells and amorphous thin film solar cells. While bulk-type crystalline solar cells are widely used, the crystalline solar cells have high production cost due to expensive silicon substances and complicated manufacturing processes. However, by forming a solar cell of a thin film type on a relatively low cost substrate, such as glass, metal, or plastic, instead of a silicon wafer, reduction of photovoltaic production cost can be achieved.

Different photovoltaic materials are available to be deposited with various deposition methods on a variety of substrates, and the resultant thin-film solar cells are usually categorized according to the photovoltaic material used. Group IB/IIIA/VIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Generally, photovoltaic compounds that include amorphous silicon (a-Si), Cadmium telluride (CdTe), and Copper-Indium-Gallium-Selenide (CIS or CIGS) are referred to as thin film solar cells.

Polycrystalline Copper Indium Gallium Diselenide or Cu(In,Ga)Se2 (CIGS) is the most promising of all thin film solar cells. Recently, the record efficiency of laboratory size CIGS thin film solar cells reached 20.8%. A typical device structure for a CIGS solar cell is illustrated in FIG. 1.

In this review and throughout the present invention disclosure, the different pieces of the solar cell will be referred to as shown in FIG. 1. In other words, 100 refers to the substrate, which can be made of Glass (e.g. Soda-Lime-Glass (SLG) or flexible glass), Metallic sheets or Plastic sheets (e.g. Polyimide); 101 refers to the barrier layer (e.g. SiO2 or SiN), 102 refers to the back contact layer which can be made of one or more refractory metals like Molybdenum (Mo), Niobium (Nb), Tantalum (Ta), Tungsten (W) and/or Rhenium (Re); 103 refers to the CuInGaSe2 (CIGS) absorber layer; 104 refers to the buffer layer which can be made of CdS, ZnS, ZnO, In2Se3, and/or In2S3; 105 refers to an intrinsic layer (e.g. i-ZnO) followed by a transparent conduction oxide-TCO layer (e.g. Indium-Tin-Oxide (ITO) or Al:ZnO or Gallium doped ZnO); and 106 refers to the metallic grids and Anti-reflecting (AR) coating.

Typically, a CIGS thin film may be deposited on a number of substrates 100 including glass (whether rigid or flexible), metallic sheets or plastic sheets (e.g. polyimide). A barrier layer 101 may be deposited on the substrate to minimize and/or prevent the diffusion of impurities from the substrate to the CIGS thin film. A back-contact layer 102 (e.g. Molybdenum-Mo or another refractory metal layer of about 1 µm thickness) may be deposited on the barrier-layer coated substrate using DC magnetron sputtering. On top of the back-contact layer 102, a CIGS layer 103 is deposited. For making solar cells, a CIGS chalcopyrite structure is required. Co-evaporation yielded the best device conversion efficiency of 20.8%. A typical high efficiency CIGS device has a Cu/(In+Ga) ratio of 0.80-1.0 and a Ga/(In+Ga) ratio of ~0.30. This Ga/(In+Ga) ratio can be varied from 0-1. The formation of CIGS thin film requires high temperature (450-800° C.). To complete the solar cell structure, a thin buffer layer 104 of about 500-1200 Å thickness (e.g. Cadmium Sulfide-CdS) is deposited on top of the CIGS layer, followed by depositing an intrinsic layer followed by depositing a transparent conducting oxide-TCO (e.g. i-ZnO/Al—ZnO or i-ZnO/ITO) 105; followed by depositing metallic front contacts and anti-reflecting coating (AR) 106. The best known method for depositing CdS, TCO and front contacts are Chemical Bath Deposition (CBD), RF sputtering and evaporation, respectively.

A temperature in the range of (450-800° C.) is usually required to make Cu-poor CIGS chalcopyrite structures from which CIGS thin film solar cells can be made. This temperature range is usually achieved by traditional heating methods (e.g. Infrared heating or Resistive/Electrical heating).

Currently in the existing art, there are two approaches to activate the formation of the CIGS chalcopyrite structure:
Approach I:
In this approach, all four elements (Cu, In, Ga and Se) are deposited by Physical Vapor Deposition-PVD) onto an IR-heated substrate 100 which is already coated with a barrier layer 101 and/or back contact layer 102. As shown in FIG. 1, the substrate 100 can be Soda-Lime-Glass, other types of glass, a Metallic sheet or a Plastic sheet such as Polyimide. An appropriate heat profile such as the well-known three-stage process can be used.

In the first stage of the three-stage process, In and Ga are evaporated in the presence of Se vapor onto a heated substrate (at about 400° C.). In the second stage of the three-stage process, Cu is evaporated in the presence of Se vapor onto the heated substrate (at about 600° C.). In this stage, Cu-rich CIGS phase is formed. In the third stage, small amounts of In and Ga are evaporated to convert the CIGS structure into the Cu-poor Chalcopyrite CIGS phase from which CIGS thin film solar cells can be made. All stages are usually implemented under high vacuum (preferably a pressure of less than $1\times10^{-6}$ Torr). Typically, depositing a CIGS film using the three stage process takes about 40 minutes. Usually, Sodium which is an important dopant for CIGS crystallization is introduced through the Soda-Lime-Glass (which has Na as part of its constituents) or from an external source to have a better control on the amount introduced or if a different substrate is used.

Approach II:

In this approach, Cu, In and Ga are deposited onto an unheated substrate 100 which is already coated with a barrier layer 101 and/or a back contact layer 102 as depicted in FIG. 1. Sodium (Na) which is an important dopant for CIGS crystallization is introduced through the Soda-Lime-Glass or from an external source to a have better control on the amount introduced or if a different substrate is used.

The (Cu,In,Ga) layer deposited on 102/101/100 structure is then placed inside a furnace that's capable of going up to the CIGS crystallization temperature of (400-800° C.). The structure is then heated up to >400° C. in the presence of Se. This selenization and heating steps are necessary to activate the formation of the CIGS chalcopyrite structure.

In both approaches above, traditional heating methods (Infra-Red-IR heating or resistive/electrical heating) are usually used as the methods for heating the substrate and activating the formation of CIGS.

Typically, Approach I results in more uniform compositional uniformity compared with Approach II which results in the well-known Ga-segregation problem in the back of the thin film and lateral compositional non-uniformity. Since In and Ga compete for Se, along with Cu, the composition of all elements is non-uniform and this causes losses in solar cell performance.

Lateral compositional non-uniformity and Ga segregation in the back of the film are more dominant in Approach II described above for the formation of the CIGS chalcopyrite structure from which thin film CIGS solar cells are made. In both approaches described above for activating the CIGS formation, Ga has the least compositional uniformity, laterally and along the depth of the film. This is because of Ga physical properties. Because of Ga segregation problem, Sulfur can be used to increase the bandgap near the surface of Cu(In,Ga)(S,Se)2.

In the process of manufacturing CIGS thin films, there are various manufacturing challenges such as maintaining the structural integrity of substrate materials, ensuring uniformity and granularity of the thin film material, minimizing materials loss during the deposition process, etc. Conventional techniques that have been used so far are often inadequate in various situations and are so far incapable of producing cost-effective solar panels. Therefore, it is desirable to have improved systems and methods for manufacturing CIGS thin film photovoltaic devices.

Objective of the Invention

It is therefore an objective of the invention to provide a novel method and apparatus to manufacture CIGS thin films on a substrate to reduce the cost of production of a solar cell.

It is therefore an objective of the invention to provide a novel method and apparatus to manufacture CIGS thin films on a substrate to reduce production time of a solar cell.

It is therefore an objective of the invention to provide a novel method and apparatus to manufacture CIGS thin films on a substrate to increase the quality of the CIGS thin film on a substrate of a solar cell.

It is therefore an objective of the invention to provide a novel method and apparatus to manufacture CIGS thin films on a substrate using a smaller production area to produce relatively larger solar cells.

Specifically, it is an objective of the invention to provide a novel method and apparatus to manufacture CIGS thin films on a substrate using Vapor Transport Deposition (VTD) technique in an apparatus.

It is also an objective of the invention to increase material utilization of all the constituents needed to fabricate CIGS thin films and solar cells.

It is also an objective of the invention to use Vapor Transport Deposition to deposit other layers in the CIGS solar cell including but not limited NaF, buffer layers (e.g. CdS, ZnS, In2Se3, In2S3, etc.), intrinsic zinc oxide layer, transparent conducting oxide layer (TCO), metallic grids and Anti-reflecting coating.

Specifically, such Vapor Transport Deposition techniques (VTD) would include the utilization of various designed and configured heating tubes in an apparatus thereby allowing a smaller production area to produce relatively larger solar cells.

More specifically, such Vapor Transport Deposition technique includes vaporizing the material to be deposited, transporting it using a carrier gas and then depositing it on a substrate; all in one or more apparatus with controlled environment; in which the carrier gas flow rate, the temperature and the pressure are controlled.

It is also an objective of the invention to provide a novel method and apparatus to manufacture CIGS thin films on a substrate wherein the elements are sputtered onto the substrate.

It is further an objective of the invention to provide a novel method and apparatus to manufacture CIGS thin films on a substrate wherein the elements are sputtered onto the substrate in one chamber and other elements are deposited onto the substrate in the next chamber.

It is also an objective of this invention to sputter Cu in one chamber, then co-evaporate In, Ga, and Se at CIGS crystallization temperature in another chamber.

It is also an objective of this invention to sputter CuGa in one chamber, then co-evaporate In and Se in another chamber.

It is also an objective of this invention to sputter Cu in one chamber, then deposit In, Ga, and Se at CIGS crystallization temperature in another chamber using Vapor Transport Deposition (VTD).

It is also an objective of this invention to sputter CuGa in one chamber, then deposit In and Se in another chamber using Vapor Transport Deposition (VTD).

It is also another objective of this invention to sputter CuInGa using sputtering in one chamber, then evaporate Se in another chamber.

It is also another objective of this invention to sputter CuInGa using sputtering in one chamber, then deposit Se in another chamber using Vapor Transport Deposition (VTD).

It is also an objective for this invention to prepare CIGS thin films by depositing Cu using sputtering and depositing In and Ga by using CuInGa powder material as the evaporation source material, where the source material evaporation temperature ranges from 100-900° C. and using elemental Se as the source for Se.

It is also an objective for this invention to prepare CIGS thin films by depositing Cu, In and Ga using CuInGa powder material as the evaporation source material, where the source material evaporation temperature ranges from 900-1500° C. and using elemental Se as the source for Se.

It is also an objective for this invention to prepare CIGS thin films by depositing Cu using sputtering and depositing In and Ga by using Vapor Transport Deposition (VTD) of CuInGa powder material as the source material, where the source material evaporation temperature ranges from 100-900° C. and using elemental Se as the source material for Se Vapor Transport Deposition.

It is also an objective for this invention to prepare CIGS thin films by depositing Cu, In and Ga using Vapor Transport Deposition of CuInGa powder material as the evaporation source material, where the source material evaporation temperature ranges from 900-1500° C. and using elemental Se as the source material for Se Vapor Transport Deposition.

It is also an objective of the invention to use Cu as an agent to form a stable metallic CuInGa alloy and use it as a source material for In and Ga.

It is also an objective of the invention to develop a method to evaporate In and Ga from one source material using CuInGa alloys.

It is also an objective of the invention to dope CIGS with Na using NaF source or elemental Na source.

It is also an objective of this invention to dope CIGS with Na using NaF evaporation.

It is an objective of this invention to deposit elemental Na using evaporation or Close Space Sublimation or Vapor Transport Deposition.

SUMMARY OF THE INVENTION

In one aspect of the invention, a method to deposit CIGS thin film for solar panel construction comprising: providing a first chamber; providing a substrate and placing the substrate inside the first chamber; providing metallic targets wherein the metallic targets are made with elements and/or compounds selected from the group consisting of Cu, CuGa, In, CuIn and CuInGa; placing the metallic targets inside the first chamber; providing a Na-doping source; reducing pressure within the first chamber to a pressure of less than $1 \times 10^{-6}$ Torr; adding sputtering gas into the first chamber after reducing pressure within the first chamber to a pressure of less than $1 \times 10^{-6}$ Torr until the pressure in the chamber is increased to about 100 mTorr or less; sputtering the elements and/or compounds from the metallic targets to the substrate; providing a second chamber; transferring the substrate from the first chamber to the second chamber after the substrate is sputtered with the elements; providing a Se vapor into the second chamber; perform vapor deposition as to allow the Se to be deposited on the substrate.

In one embodiment, the substrate is first coated with a barrier layer. IN one embodiment, the barrier layer is made with compounds selected from the group consisting of SiN, SiO2, SiC. In one embodiment, the substrate is further coated with a back contact layer. In one embodiment, the back contact layer is selected from one or more of the refractory elements group consisting of Mo, W, Nb, Ta and Re. In one embodiment, the Na-doping source is comprised of NaF and is deposited by evaporation onto the substrate before sputtering the elements from the metallic targets to the substrate. In one embodiment, the Na doping is achieved using elemental Na from an elemental Na source. In one embodiment, the Na elemental source is introduced in the chamber 2.

In one embodiment, the Na elemental source is comprised of a thermal evaporation source, from which elemental Na is thermally evaporated. In one embodiment, the Na elemental source is comprised of Vapor Transport Deposition (VTD) system, from which a balanced mix of elemental Na and carrier gas is carried to the substrate. In one embodiment, the Na elemental source is comprised of Close Space Sublimation (CSS) from which Na vapor is delivered to the substrate. In one embodiment, the Na vapor is delivered at any stage before, during, and/or after depositing the elemental layers comprised of Cu, In, Ga, and Se. In one embodiment, the step of sputtering the elements from the metallic targets to the substrate is comprised of first sputtering CuGa from a CuGa target followed by sputtering In from In target wherein as a result the ration of Cu/(In+Ga) is between 0.7-1 and the ration of Ga/(In+Ga) is between 0-1. In one embodiment, the step of sputtering the elements from the metallic targets to the substrate is comprised of first sputtering In from In target followed by sputtering CuGa from a CuGa target wherein as a result the ration of Cu/(In+Ga) is between 0.7-1 and the ration of Ga/(In+Ga) is between 0-1.

In one embodiment, the step of sputtering the elements from the metallic targets to the substrate is comprised of first sputtering CuGa from a CuGa target followed by sputtering CuIn from CuIn target wherein as a result the ration of Cu/(In+Ga) is between 0.7-1 and the ration of Ga/(In+Ga) is between 0-1. In one embodiment, the step of sputtering the elements from the metallic targets to the substrate is comprised of first sputtering CuIn from CuIn target followed by sputtering CuGa from a CuGa target wherein as a result the ration of Cu/(In+Ga) is between 0.7-1 and the ration of Ga/(In+Ga) is between 0-1.

In one embodiment, the step of sputtering the elements from the metallic targets to the substrate is comprised of first sputtering CuGa from a CuGa target wherein ratio of Cu/Ga is greater than 1, followed by sputtering CuIn from CuIn target wherein ratio of Cu/In is less than 1, wherein as a result the ration of Cu/(In+Ga) is between 0.7-0.9 and the ration of Ga/(In+Ga) is between 0-1. IN one embodiment, the step of sputtering the elements from the metallic targets to the substrate is comprised of first sputtering CuIn from a CuIn target wherein ratio of Cu/In is less than 1, followed by sputtering CuGa from CuGa target wherein ratio of Cu/Ga is greater than 1, wherein as a result the ration of Cu/(In+Ga) is between 0.7-0.9 and the ration of Ga/(In+Ga) is between 0-1.

In one embodiment, the step of sputtering the elements from the metallic targets to the substrate is comprised of first sputtering CuGa from a CuGa target wherein ratio of Cu/Ga is less than 1, followed by sputtering CuIn from CuIn target wherein ratio of Cu/In is greater than 1, wherein as a result the ration of Cu/(In+Ga) is between 0.7-0.9 and the ration of Ga/(In+Ga) is between 0-1. In one embodiment, the step of sputtering the elements from the metallic targets to the substrate is comprised of first sputtering CuIn from a CuIn target wherein ratio of Cu/In is greater than 1, followed by sputtering CuGa from CuGa target wherein ratio of Cu/Ga is less than 1, wherein as a result the ration of Cu/(In+Ga) is between 0.7-0.9 and the ration of Ga/(In+Ga) is between 0-1.

In one embodiment, the step of sputtering the elements from the metallic targets to the substrate is comprised of simultaneously sputtering CuIn from a CuIn target; and sputtering CuGa from CuGa target wherein as a result the ration of Cu/(In+Ga) is greater than 1 and the ration of Ga/(In+Ga) is between 0-1.

In one embodiment, the step of sputtering the elements from the metallic targets to the substrate is carried out at room temperature. In one embodiment, the step of sputtering the elements from the metallic targets to the substrate wherein the substrate is heated to a temperature of less than 600° C. In one embodiment, the substrate is heated by a method selected from the group consisting of Resistive/electrical heating, Infra-red (IR) heating, and RF heating/Microwave heating. In one embodiment, the step of sputtering the elements from the metallic targets to the substrate further comprises subjecting the substrate to planar motion as the elements are sputtered onto the substrate. In one embodiment, the step of sputtering the elements from the metallic targets to the substrate further comprises subjecting the substrate to facing down as the elements are sputtered onto the substrate. In one embodiment, the step of sputtering the elements from the metallic targets to the substrate further comprises subjecting the substrate to facing up as the elements are sputtered onto the substrate.

In one embodiment, the step of sputtering the elements from the metallic targets to the substrate further comprises sputtering the elements from the metallic targets to the substrate until the elements on the substrate is approximately between 0.8-5 μm in thickness. In one embodiment, a portion of Copper Sulfide ($Cu_xS$) is sputtered onto the substrate after the step of sputtering the elements from the metallic targets to the substrate. In one aspect of the invention, A method to deposit CIGS thin film for solar panel construction is disclosed comprising: providing a first chamber and a second chamber; providing a substrate and placing the substrate inside the first chamber; providing a Cu-source in the first chamber in the form Cu-sputtering target; reducing pressure within the first chamber to a pressure of less than $1 \times 10^{-6}$ Torr; Introducing sputtering gas into the first chamber after reducing pressure within the first chamber to a pressure of less than $1 \times 10^{-6}$ Torr until the pressure in the chamber is increased to about 100 mTorr or less; providing a portion of Cu and sputtering the Cu from the Cu-sputtering target onto the substrate to form a Cu substrate; transporting the Cu substrate to the second chamber; providing a Na-doping source in the second chamber; providing thermal evaporation elements in the second chamber wherein the thermal evaporation elements are comprised of In, Ga and Se; reducing pressure within the second chambers to a pressure of less than $1 \times 10^{-6}$ Torr; heating the thermal evaporation elements, the Na-doping source and the Cu substrate in the second chamber whereby the thermal evaporation elements evaporate and are deposited onto and reacted with the Cu substrate to form a CIGS substrate.

In one embodiment, the substrate is comprised of a barrier layer and a back contact layer.

In one embodiment, the substrate in the first chamber is maintained at a temperature less than 200° C. In one embodiment, the thermal evaporation elements are comprised of In, Ga and Se. In one embodiment, the thermal evaporation elements are heated to a temperature capable of evaporating In, Ga and Se onto the Cu substrate. In one embodiment, the thermal evaporation elements/compounds are comprised of a CIG powder source and a Se source. In one embodiment, the CIG powder source is heated to a temperature capable of evaporating In and Ga; but not Cu. In one embodiment, the temperature is less 1000° C. In one embodiment, the Na-doping source is comprised of NaF and is deposited by evaporation onto the substrate before sputtering the Cu from the Cu-sputtering target to the substrate. In one embodiment, the Na doping is achieved using elemental Na from an elemental Na source. In one embodiment, the Na elemental source is introduced in the chamber 2. In one embodiment, the Na elemental source is comprised of a thermal evaporation source, from which elemental Na is thermally evaporated. In one embodiment, the Na elemental source is comprised of Vapor Transport Deposition (VTD) system, from which a balanced mix of elemental Na and carrier gas is carried to the substrate. In one embodiment, the Na elemental source is comprised of Close Space Sublimation (CSS) from which Na vapor is delivered to the substrate. In one embodiment, the Na vapor is delivered at any stage before, during, and/or after depositing the elemental layers comprised of Cu, In, Ga, and Se.

In one aspect of the invention, a method to deposit CIGS thin film for solar panel construction comprising: providing a first chamber and a second chamber; providing a substrate and placing the substrate inside the first chamber; providing a portion of Cu and sputtering the Cu onto the substrate to form a Cu substrate; transporting the Cu substrate to the second chamber; providing a source material in the second chamber wherein the source material is introduced into the second chamber via a heating tube and distribution assembly; heating the source material through the heating tube and distribution assembly and converting the source material to a vaporized form; introducing carrier gas to direct the source material in vapor form to the Cu substrate via the heating tube and distribution assembly thereby depositing the source material onto the Cu substrate to form Na-doped CIGS substrate; Heating the substrate to the CIGS crystallization temperature ranging from 400-800° C.

In one embodiment, the source material is comprised of In, Ga, Se, NaF, and/or elemental Na. In one embodiment, the source material is comprised of a portion of CIG powder. In one embodiment, the carrier gas is comprised of Nitrogen, Argon, Helium, Neon and/or Xenon. In one embodiment, the source material is comprised of heating tubes. In one embodiment, the heating tubes are made of SiC, MoSi2, Ta, Graphite Mo, Mullite and/or Alumina. In one embodiment, the source materials are placed inside the heating tubes. In one embodiment, the source material are comprised of In, Ga, Se and a Na-doping source. In one embodiment, the Na-doping source is comprised of elemental Na. In one embodiment, the Na-doping source is comprised of NaF. In one embodiment, the source materials are placed inside the heating tubes. In one embodiment, the heating tubes and the distribution assembly are heated to temperatures capable of vaporizing In, Ga, Se and the Na-doping source. In one embodiment, the vapors are delivered to the Cu substrate via the carrier gas. In one embodiment, the vapors and the carrier gas form an optimal mix. In one embodiment, the vapor/gas mix is delivered to the substrate facing downward, upward or in any other direction. In one embodiment, the source materials are comprised of CIG powder, Se and Na-doping source. In one embodiment, the Na-doping source is comprised of NaF. In one embodiment, the Na-doping source is comprised of elemental Na. In one embodiment, the source materials are placed inside the heating tubes. In one embodiment, the heating tubes and the distribution assembly are heated to temperatures capable of vaporizing CIG, Se and the Na-doping source. In one embodiment, CIG powder is heated to a temperature capable of vaporizing the In and Ga, but not Cu. In one embodiment, the temperature is less than 1000° C.

In one embodiment, the vapors are delivered to the Cu substrate via the carrier gas. In one embodiment, the vapors and the carrier gas form an optimal mix. In one embodiment, the vapor/gas mix is delivered to the substrate facing downward, upward or in any other direction. In one embodiment, the temperature is more than 1000° C. In one embodiment, the temperature is capable of vaporizing CIG powder into CIG vapors. In one embodiment, the vapors are delivered to a substrate via the carrier gas. In one embodiment, the substrate is made of glass, metal sheets or polyimide. In one embodiment, the substrate is coated with the barrier layer and the back contact layer. In one embodiment, the vapors and the carrier gas form an optimal mix. In one embodiment, the vapor/gas mix is delivered to the substrate facing downward, upward or in any other direction to form Na-doped CIGS film. In one embodiment, the vaporizing temperatures are optimize to get a Na-doped CIGS thin film with $0.50<Cu/(In+Ga)<1$, $0<Ga/(In+Ga)<1$ and $2*Se/[Cu+3*(In+Ga)]$ of about 100%. In one embodiment, the Na-doping source is heated to a temperature capable of producing a Na-doped CIGS thin film which has a Na concentration of less than 4 at. %. In one embodiment, the substrate is heated the CIGS crystallization temperature ranging from 400-800° C.

In one aspect of the invention, A solar cell apparatus is disclosed comprising:

a first substrate layer; a first solar cell layer positioned over the first substrate layer; a first buffer layer positioned over the first solar cell layer; a first conductive layer positioned over the first buffer layer; a second conductive layer positioned over first conductive layer; a second solar cell layer positioned over the second conductive layer; a second buffer layer positioned over the second solar cell layer; a third conductive layer positioned over the second buffer layer. In one embodiment, the second conductive layer is an ionic gas layer. In one embodiment, the second conductive layer is comprised of transparent conductive Graphene. In one embodiment, the second conductive layer is comprised of heavily doped and transparent layer ($n^{++}$). In one embodiment, the ionic gas layer is sealed wherein the ionic gas is trapped inside the ionic gas layer. In one embodiment, the first solar cell layer is comprised of CuInGaSe2. In one embodiment, the first solar cell layer is comprised of c-Si. In one embodiment, the second solar cell layer is comprised of CuGaSe2. In one embodiment, the second solar cell layer is comprised of amorphous Silicon (a-Si). In one embodiment, the second solar cell layer is comprised of CuSeSe2. In one embodiment, the first solar cell layer has a bandgap of less than 1 eV. In one embodiment, the second solar cell layer has a bandgap of greater than 1.5 eV. In one embodiment, the first buffer layer and the second buffer layer are comprised of CdS. In one embodiment, the first buffer layer and the second buffer layer are comprised of ZnS. In one embodiment, the first and third conductive layers are comprised of transparent conducting oxide. In one embodiment, the first and second solar cells are monolithically integrated. In one embodiment, the first substrate is comprised of glass, metallic sheet, or polyimide. In one embodiment, the first substrate is coated with a barrier layer and a back contact layer. In one embodiment, the barrier layer is comprised on SiO2, SiN, or SiC. In one embodiment, the back contact layer is comprised of a refractory metal. In one embodiment, the refractory metal is comprised of Mo, Re, Nb, Ta and/or W.

In One aspect of invention, a solar cell apparatus comprising: a first solar cell; a first substrate; a first barrier layer coated onto the first substrate; a first back contact layer coated onto the first barrier layer; a first solar cell layer positioned over the first back contact layer; a first buffer layer positioned over the first solar cell layer; a first transparent conductive layer positioned over the first buffer layer; a second solar cell; a transparent substrate; a second transparent conductive layer positioned onto the second transparent substrate; a second solar cell layer positioned over the second conductive layer; a second buffer layer positioned over the second solar cell layer; a third transparent conductive layer positioned over the second buffer layer.

In one embodiment, wherein the second solar cell is connected to the first solar cell wherein the third transparent conductive layer is mechanically connected to first transparent conductive layer. In one embodiment, the mechanical interconnection is achieved by using conductive transparent glue. In one embodiment, the mechanical connection is achieved by using wires. In one embodiment, the mechanical connection is achieved by using a thin layer of transparent and conductive graphene glue. In one embodiment, the mechanical connection is achieved by using a thin layer of transparent and conductive Graphene Oxide (GO). In one embodiment, the mechanical connection is achieved by using an ionic gas layer wherein the ionic gas layer is sealed and trapped inside the ionic gas layer. In one embodiment, the first solar cell layer is comprised of CuInGaSe2. In one embodiment, the first solar cell layer is comprised of c-Si. In one embodiment, the second solar cell layer is comprised of CuGaSe2. In one embodiment, the second solar cell layer is comprised of amorphous Silicon (a-Si). In one embodiment, the second solar cell layer is comprised of CuSeSe2. In one embodiment, the first solar cell layer has a bandgap of less than 1 eV. In one embodiment, the second solar cell layer has a bandgap of greater than 1.5 eV. In one embodiment, the first buffer layer and the second buffer layer are comprised of CdS. In one embodiment, the first buffer layer and the second buffer layer are comprised of ZnS. In one embodiment, the first and third conductive layers are comprised of transparent conducting oxide.

BRIEF DESCRIPTION OF THE DRAWINGS

These and other features and advantages of the invention will not be described with reference to the drawings of certain preferred embodiments, which are intended to illustrate and not to limit the invention, and in which.

DETAIL DESCRIPTION OF THE INVENTION

Figure 1:
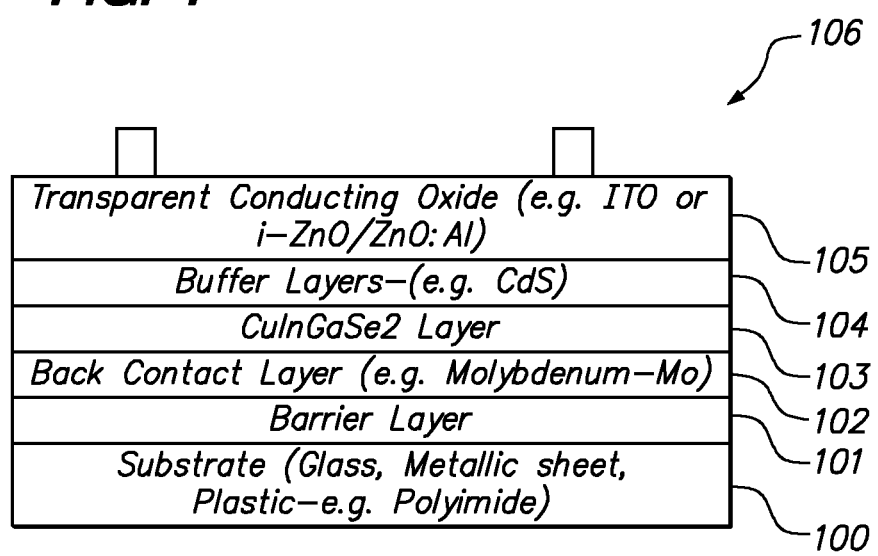
FIG. 1 is a schematic diagram illustrating a typical CIGS solar cell structure, including a CIGS thin film deposited on a number of substrates.

The following detailed description of the preferred embodiments presents a description of certain specific embodiments as examples of a plurality of ways to practice this invention. As such, one may practice the present invention in a multitude of different embodiments as defined and covered by the claims.

In some instances, certain features are described in less or more detail. The level of detail associated with each of the elements or features should not be constructed to qualify the novelty or importance of one feature over the others.

Certain marks referenced herein may be trademarks, whose use is to provide an enabling disclosure by way of example and shall not be construed to exclusively limit the scope of the disclosed subject matter to material associated with such marks.

References in this specification to "an embodiment", "one embodiment", "one or more embodiments" or the like, simply mean that the particular element, feature, structure or characteristic being described is in at least one embodiment of the disclosed subject matter. The occurrences of such phrases do not necessarily refer to the same embodiment, nor do they necessarily to mutually exclusive embodiments with respect to the discussed features or elements.

In the present invention, a method and apparatus for depositing CIGS thin films and other materials are described. At ambient temperature (RT), Cu, In and Se have solid phases, whereas Ga has a liquid phase. There are multiple ways to deposit CIGS thin films on glass sheets (rigid or flexible), metallic sheets or plastic sheets (e.g. Polyimide). As described in Approach I as stated the background section, Physical Vapor Deposition (PVD) (either evaporation or sputtering) can be used to deposit CIGS on the different substrates.

Sodium acts as a dopant for CIGS and it is required to be introduced regardless of the CIGS deposition method used. Na can be introduced through Soda Lime Glass (SLG) in case this substrate is used. For other substrates such as metallic sheets, plastic sheets and Na-free glass substrates, Na can be introduced by using a source material (e.g. NaF) which can be deposited as a separate layer before depositing CIGS thin film, or in-situ deposition (by evaporation or sputtering) during the CIGS deposition process. The substrate can be flexible glass sheets (e.g. Corning® Willow™ Glass), or rigid glass sheets or metallic sheets or plastic sheets. In reference to FIG. 1, A barrier layer 101 (e.g. Silicon Dioxide-$SiO_2$, Silicon Carbide-SiC, or Silicon Nitride-SiN) can be deposited on a cleaned-substrate 100 using PVD or other methods, followed by depositing the back contact layer 102 (e.g. any refractory metal such as: Molybdenum (Mo), Tungsten (W), Niobium (Nb), Tantalum (Ta), etc.) by DC magnetron sputtering.

Specifically, in the present invention, there is a number of methods to deposit the CIGS layer 103 on 102/101/100 To complete the CIGS solar cell, a buffer layer 104 can be deposited by a number of methods (e.g. Chemical Bath Deposition-CBD, Physical Vapor Deposition-PVD, etc.), followed by the deposition of an intrinsic layer (e.g. i-ZnO); followed by the deposition of a Transparent Conducting Oxide layer 105 (e.g. ITO or Al—ZnO or Gallium doped ZnO); followed by depositing the metal grids and anti-reflecting coating layers 106.

I. Method 1

In one embodiment, the method utilizes sputtering as the deposition method for depositing CIGS thin films on 102/101/100 structure as depicted in FIG. 1. Referring to FIG. 1, Cu, CuGa, In, CuIn and/or CuInGa sputtering metallic targets can be used to deposit the Cu, In and Ga metals and/or their alloys on 102/101/100 structure such that Cu/(In+Ga) ratio ranges from 0.80-1 and Ga/(In+Ga) ranges from 0-1. Several combinations of sputtering targets can be used to deposit the metallic structure (elemental metals and/or their alloys) on the different substrates and achieve these ratios. In one embodiment, a small amount of NaF (specifically less than 500 Å) can be deposited on top of the 102 layer by sputtering or evaporation. In another embodiment, NaF can also be deposited between the different sputtered layers. The sputtering system should have adequate pressure levels (less than 100 mTorr) to achieve high quality sputtering.

Figure 2:
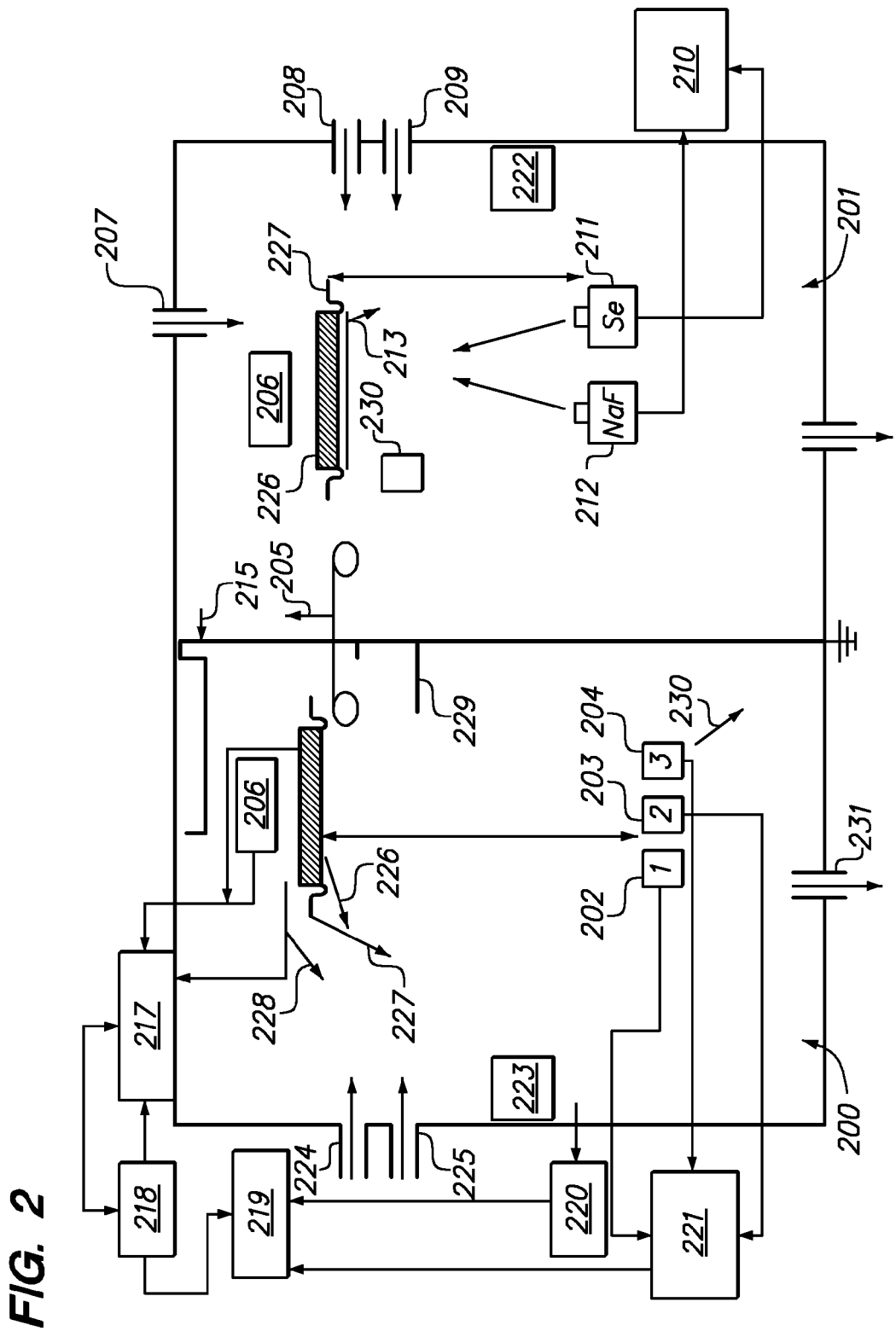
FIG. 2 is a schematic diagram illustrating a Sputtering Chamber for depositing Cu, In, Ga, and their metallic alloys; and a Selenization Chamber for Selenizing the Cu, In, Ga, and their metallic alloys.

Referencing to FIG. 2, the diagram depicts a sputtering apparatus of present invention, comprising a sputtering chamber 200 and a selenization chamber 201. Specifically, in one embodiment, the sputtering chamber 200 is comprised of a power source 218 which is linked to a computer system 219 which also is linked to measurement controls 217 that controls the heater 206 and monitors temperature 216 and to that effect activates the heater 206 to control the temperature 228. In one embodiment, the sputtering chamber 200 is also comprised of a vacuum pump which is linked to the computer system 219 which controls the environment 223 at pressure of less than 100 m Torr. A electrical power source 221 is also provided which is linked to the computer system 219 which provides power to sputter the sputtering targets 230 which in one embodiment is at least comprised of target 1 of In 202, target 2 of Cu 203 and target 3 of Cu(In)Ga 204. In addition, the sputtering chamber 200 is also comprised of various inlets including inlet 224 which allows for sputtering gas 224 to come in. In one embodiment, the sputtering gas can be Ar, Other inlet is also included such as inlet 225 that allows N2 gas to come in and inlet 231 which provides for excess gas to escape. In another embodiment, the sputtering chamber is also comprised of a gate 215 which allows for gate to open or close wherein when the gate 215 is opened substrate 226 can be transferred on the conveyer 205 from sputtering chamber 200 to the selenization chamber 201. The substrate 226, in one embodiment can be comprised of 102/101/100. In one embodiment, a susceptor 232 can be placed on the substrate 226. Also in chamber 200 is a conveyer belt 205 which can carry the substrate 226 from sputtering chamber to the selenization chamber 201. In one embodiment, the sputtering 206 chamber also incorporates a shield 229 the separates the sputtering targets 230 from the substrates 226.

In another embodiment, the selenization chamber 201 is linked to the sputtering chamber at least by the conveyer belt 205. In the selenization chamber 201 is another heater which controls the environment 222. The chamber 201 also has inlet 207 allowing N2 gas to flow in, 208 for H2 gas to flow in and 209 for H2Se gas to flow in. Also included in the chamber 201 is another electrical source 210 for powering on Se source 211 to selenize the substrate 226 and for powering on the dopant NaF source 212 to dope the Cu, In, Ga, Se structure already deposited on the substrate 226. Further the chamber is comprised of a shutter 213 which, when opened, allows the substrate 226 to be selenized.

In one embodiment, after the deposition of the metals and/or their alloys (with total thickness less than 2.5 µm), the structure with the deposited metallic precursors is transferred using a conveyer 205 from the sputtering chamber 200 to the selenization chamber 201 for selenization. Selenization chamber 201 can also be used to deposit NaF by evaporation. In one embodiment, NaF can also be deposited in the sputtering chamber 200. DC magnetron sputtering can be used to sputter all Cu, In, Ga metals and their alloys.

Moreover, still referencing to FIG. 2, target 1 202 of In, target 2 203 of Cu and/or target 3 204 of Cu(In)Ga can be replaced by other targets that already have Se. Examples of these Se containing targets are: CuxSe, (In,Ga)xSe3, In2Se3, Ga2Se3, CuInSe2, and/or CuInGaSe2. For these targets, DC and/or RF sputtering can be used. The 102/101/100 substrate structure 226 needs to be heated during the deposition of Cu, In, Ga and/or Se elements and/or their alloys and/or their compounds to temperatures greater than 400° C. to achieve the formation of Chalcopyrite CIGS structure from which thin film solar cells can be made.

Following is a summary of different embodiments of present invention wherein different procedures for depositing CuInGaSe2 (CIGS) thin films on glass (whether rigid or flexible) metallic sheets or plastic sheets (e.g. Polyimide) substrates are disclosed:

1. In one embodiment, Layer 101 can be a barrier layer (e.g. SiN, SiO2, SiC, etc.) that prevents the diffusion of impurities into the CIGS film. Layer 101 can be deposited by PVD or CVD or any other method. On top of layer 101, a back contact layer 102 of less than 1.5 µm thickness (e.g. any refractory metal such as: Molybdenum (Mo), Tungsten (W), Niobium (Nb), Tantalum (Ta), etc.) can be deposited by DC magnetron sputtering. In reference to FIG. 2, the 102/101/100 structure is then loaded into the sputtering chamber. The system is then pumped down to low pressure ($<1\times10^{-6}$ Torr). The sputtering gas (e.g. Ar) is then flown into the chamber until the pressure reaches about 100 mTorr or less (typically 30 mTorr).

2. In one embodiment, Sodium Fluoride (NaF) thickness of less than 500 Å can be deposited (by evaporation for example) prior to the deposition of the metals on top of the back contact layer (102).

3. In one embodiment, Cu, In, Ga and/or their alloys can be deposited on top of the NaF layer, referring to FIG. 2: this step of the process maybe achieved using the following different combinations:

3.1. Sputter CuGa from a CuGa target followed by In from In target such that Cu/(In+Ga) and Ga/(In+Ga) ratios range from 0.8-1 and from 0-1, respectively. Total thickness for metallic precursor is less than 2.5 µm.

1.2. Sputter In from In target followed by CuGa from a CuGa target such that Cu/(In+Ga) and Ga/(In+Ga) ratios range from 0.8-1 and from 0-1, respectively. Total thickness for metallic precursor is less than 2.5 µm.

1.3. Sputter CuGa from a CuGa target, followed by sputtered CuIn from CuIn target such that Cu/(In+Ga) and Ga/(In+Ga) ratios range from 0.8-1 and from 0-1, respectively. Total thickness for metallic precursor is less than 2.5 µm.

1.4. Sputter CuIn from a CuIn target, followed by sputtered CuGa from CuGa target such that Cu/(In+Ga) and Ga/(In+Ga) ratios range from 0.8-1 and from 0-1, respectively. Total thickness for metallic precursor is less than 2.5 µm.

1.5. Sputter CuGa from a CuGa target such that Cu/Ga>1, followed by sputtering CuIn from a CuIn target such that Cu/In is <1 so that the final Cu(In+Ga) is <1 (in the range of 0.80-0.90) and the final Ga/(In+Ga) ratio is the 0-1 range. Total thickness for metallic precursor is less than 2.5 µm.

1.6. Sputter CuIn from a CuIn target such that Cu/In<1, followed by sputtering CuGa from a CuGa target such that Cu/Ga is >1 so that the final Cu(In+Ga) is <1 (in the range of 0.80-0.90) and the final Ga/(In+Ga) ratio is in the 0-1 range. Total thickness for metallic precursor is less than 2.5 µm.

1.7. Sputter CuGa from a CuGa target where Cu/Ga<1, followed by sputtering CuIn from a CuIn target where Cu/In is >1 so that the final Cu(In+Ga) is <1 (in the range of 0.80-0.90) and the final Ga/(In+Ga) ratio is the 0-1 range. Total thickness for metallic precursor is less than 2.5 µm.

1.8. Sputter CuIn from a CuIn target where Cu/In >1, followed by sputtering CuGa from a CuGa target where Cu/Ga is <1, so that the final Cu(In+Ga) is <1 (in the range of 0.80-0.90) and the final Ga/(In+Ga)

ratio is in the 0-1 range. Total thickness for metallic precursor is less than 2.5 μm.

1.9. Co-sputter CuGa, CuIn, CuInGa, Cu and/or In such that Cu/(In+Ga) is slightly greater than 1 and Ga/(In+Ga) ratio is anywhere from 0-1. Selenize this structure as described below. The film in this case is slightly Cu-rich. Sputter a thin layer of In in order to bring the Cu/(In+Ga) to less than 1 (0.80-0.90), then selenize again as described below.

1.10. The substrate temperature for all steps in 3.1-3.9 above is ambient temperature. In other words, there is no intentional heating.

1.11. Same as 3.1-3.10 above, but with the substrate heated to a substrate temperature of less than 800° C. and greater than ambient temperature. Resistive/electrical heating or Infra-red (IR) heating can be used to heat the substrate. RF/Microwave heating can also be used.

1.12. Same as 3.1-3.11 above but the substrate structure 102/101/100 is in planar motion to achieve better composition uniformity.

1.13. In all the steps 3.1-3.12, the substrate structure 102/101/100 is facing down and the sputtering direction is up. All depositions will be on layer 102 that faces the targets.

1.14. Same as 3.1-3.13, but the substrate is now facing up and the sputtering direction is downward.

4. In one embodiment, once the desired thickness of the Cu, In, Ga and their metallic alloys is achieved (less than 2.5 μm), electrical power 221 on the respective targets can be turned off.

5. In one embodiment, the sputtering and the selenization chambers depicted in FIG. 2 can be pumped down to less than $1 \times 10^{-6}$ Torr pressure.

6. In one embodiment, N2 gas flow rate in the sputtering chamber 200 and the selenization chamber 201 depicted in FIG. 2 can be adjusted in such away that the selenization chamber 201 has lower pressure. This must be done before opening the gate so that no Se moves into the sputtering chamber 200.

7. In one embodiment, the gate 215 can be opened. It is important to keep the pressure in the sputtering chamber 200 greater than the pressure in the selenization chamber 201.

8. In one embodiment, the [(Cu,In,Ga)/102/101/100] structure with the substrate being glass (whether rigid or flexible) or metallic sheet or plastic sheet can be transferred using the conveyer 205 shown in FIG. 2 from the sputtering chamber to the selenization chamber. After the [(Cu,In,Ga)/102/101/100] structure is transferred, then the gate 215 can be closed.

9. In one embodiment, the [(Cu,In,Ga)/102/101/100] structure can be selenized using Se vapor arriving at the [(Cu,In,Ga)/102/101/100] structure from the Se source (open boat or crucible) using the following procedures. Na can also be deposited by thermal evaporation in selenization chamber 201. Se and NaF can also be deposited by sputtering.

9.1. The power of Se thermal source can be turned on. As a result Se vapor will start flowing towards the (Cu,In,Ga) layer precursor that has been deposited on the 102/101/100 structure. Some time needs to be waited to stabilize Se deposition rate.

1.2. The 102/101/100 structure can be heated using resistive heating or IR heating or RF and Microwave heating until 102/101/100 structure reaches the CIGS crystallization temperature which is greater than 400° C.

1.3. Resistive heating can be achieved by placing a susceptor 227 (e.g. graphite or SiC) on the back of the 102/101/100 substrate structure 226 and heat will then transfer to the layers 101 and 102. Alternatively, IR heating can also be used with or without a susceptor 227 on the back of the substrate S. RF and Microwave heating can also be used with and without a susceptor 227. With no susceptor 227, the RF and Microwaves will heat the glass since it's a dielectric. A RF and Microwave heating method for forming CIGS thin films as disclosed by Abushama in provisional invention application No. 61/773,984 can also be used. The method disclosed in the aforementioned invention application can be used to heat the metals and/or the dielectrics. This method will help obtain uniform composition, especially for Ga. A susceptor 227 on the back of the 102/101/100 substrate structure 226 can also be used for RF and Microwave heating.

1.4. The susceptor 227 can be graphite or Silicon Carbide-SiC which is an excellent absorber of RF and Microwaves.

1.5. Once Se deposition rate and the temperature of the [(Cu,In,Ga) precursor/102/101/100] structure are both stabilized to the targeted values, then the shutter 213 can be opened and the Cu,In,Ga precursor can be fully selenized after which a CIGS thin film with large grains and good material properties is formed. The target Cu/(In,Ga) ratio is 0.80-1 and the Ga/(In+Ga) ratio ranges from 0-1.

10. In another embodiment to 9 above, the [(Cu,In,Ga) precursor/102/101/100] structure can be selenized using Se vapor arriving at the [(Cu,In,Ga)/102/101/100] structure from the Se source (open boat or crucible), along with Hydrogen gas at a temperature in the range of 50-800° C. The heating methods mentioned in 9 above can be used. Once the [(Cu,In,Ga)/102/101/100] structure is loaded in Chamber 201 as shown in FIG. 2, and heated to the targeted temperature then the [Cu,In,Ga] precursor can be selenized using the following steps:

10.1. The [(Cu,In,Ga)/102/101/100] can be annealed with H2 to remove any oxygen and form water vapor as a byproduct. The temperature in this case can range from 50-700° C. for a time ranging from 1-10 mins.

10.2. While keeping the H2 gas running, the Se source can be turned on. This step will allow the selenization of the [Cu,In,Ga] precursor to start and will also allow the formation of H2Se. Both Se vapor and H2Se will selenize the metallic precursor and convert it into a CuInGaSe2 absorber. In other words, passing Hydrogen forming gas through Se vapor will cause the formation of H2Se which is used to uniformly selenize the metallic [Cu, In, Ga] precursor. H2Se allows a more uniform selenization of the metallic structure under vacuum and/or under atmospheric pressure.

10.3. A mix of Nitrogen gas (or Argon gas) and Hydrogen gas can also be used as shown in FIG. 2.

10.4. Se can be turned on/off, Hydrogen gas can also be turned on/off, and/or N2/Ar gases as depicted in FIG. 2 can be turned on/off as needed until a high quality grain morphology and high device efficiency are achieved.

10.5. The above steps in 10.1-10.4 presents a sequential process for selenizing the metallic structure using Hydrogen gas, Se gas, Nitrogen gas and/or Argon gas.

10.6. Alternative to 10.1-10.5 above, H2Se can be used from an H2Se source.

II. Method 2

Moreover, evaporation can also be used to prepare CIG(S)S thin films. Evaporation sources can be: CuGa, In, Ga, CuInGa, Se, CuxSe, (In,Ga)2Se3, In2Se3 and/or Ga2Se3. All steps described in Method 1 above for preparing the metallic [(Cu,In,Ga)/102/101/100] can be applied herein with the exception that the [Cu,In,Ga] precursor is now prepared by evaporation in a closed system that has high vacuum (less than $1\times10^{-6}$ Torr) with Cu/(In+Ga) and Ga/(In+Ga) ratios of 0.80-1 and 0-1, respectively. Consistent with previous notation, [(Cu,In,Ga)/102/101/100] is collectively referred as the substrate structure 226. During CIGS deposition, 226 needs to be heated to a temperature capable of crystallizing CIGS and forming the chalcopyrite structure from which high efficiency solar cells can be made. All selenization procedures described in Method 1 above can also be applied in Method 2. In-situ selenization can also be applied. In this case, Se vapor (or H2Se gas) can be introduced simultaneously or sequentially with the metals and/or their alloys onto the heated 102/101/100 substrate structure 226. 226 can be heated to 400-800° C. The substrate to source distance can range from 2 mm to 40 cm. A bill jar system can be used for the larger distances, but a tool of different design needs to be used for the smaller distances.

III. Method 3

Another method that can be used includes sulfur. In this method, CuxS (0<x<1) is sputtered on top of Cu, In, Ga structure (whether prepared by Method 1 or Method 2 above). The structure is then transferred to the selenization chamber for selenization/sulfurization using the following scheme:
A layer of Copper Sulfide (CuxS) can be sputtered or evaporated on top of the [Cu, In, Ga] structure (whether prepared by Method 1 or Method 2 above), the structure can then be annealed at a temperature greater than 200° C. using Nitrogen gas for a short time. After that, the same structure can be annealed using the sequential H2, Se, N2/Ar process described above with and without the presence of Nitrogen gas until the structure is completely converted into CuIn-GaSSe2 thin film of less than 5 μm thickness. This anneal step can be implemented at a temperature greater than 400° C. with a fast temperature ramp rate. Following this step, the structure can be annealed at high temperature in the presence of Nitrogen gas for a period of time less than 2 hours.

IV. Method 4

The object of this method is to present an apparatus and process for making CIGS thin films (103 in FIG. 1). The other layers: 101, 102, 104, 105 and 106 as shown in FIG. 1 can also be made using the same method. This method is capable of making CIGS thin solar cells shown in FIG. 1 to generate electrical power at low cost. This method is also capable of making high quality materials (e.g. CIGS) from which small area and large area solar cells can be made.

The above objectives can be achieved by establishing a controlled, contained and monitored environment heated steadily and uniformly during the processing to a temperature that is capable of maintaining the vapor phase for a material from the time it vaporizes to the time its vapor condenses on the substrate or reacts with another material that has been already deposited on the substrate. The source material can be liquid, solid or gas. In the case of solid phase, the source material can be powder or small pieces. This invention also presents the use of pressure differential, mechanical design, carrying gas, forming gas and/or selenizing gas to achieve directing the vapor to the substrate on which the material will be deposited. Moreover, this invention also provides a method of delivering pure vapor material (i.e. free of any solid particles that may originate from the source material) of the source material that is capable of making high quality thin films. The temperature of the vapor surroundings and environment should be capable of keeping the material in its vapor phase from the time it vaporizes until the time it condenses on the substrate. Generally, different materials sublime at temperatures below their melting points at which temperature material starts vaporizing. For example, Selenium (Se) melts at a temperature of ~221° C. and sublimes at a temperature lower than that. In reference to FIG. 3, the 102/101/100 substrate structure will be referred to as the substrate 300. Generally, the CIGS absorber layer forms at a temperature in the range of 300-800° C. Therefore, the contained environment can be kept at the adequate temperature to maintain the vapor phase of the material to be deposited from the moment it vaporizes to the moment it condenses on substrate 300.

Figure 3:
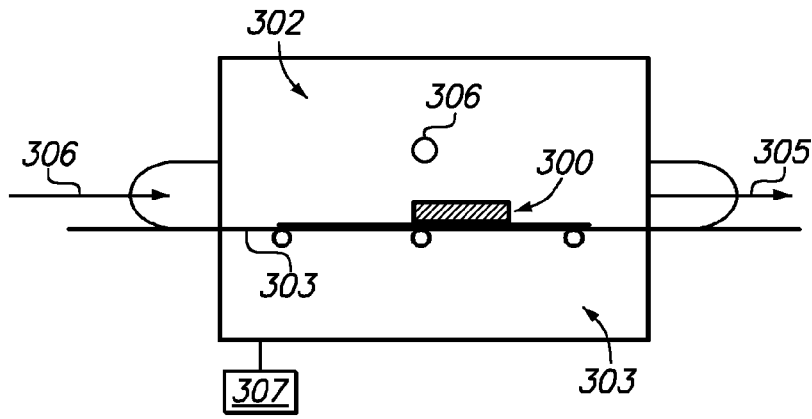
FIG. 3 is a schematic diagram illustrating a general view of the apparatus of a deposition system for depositing a material on a substrate.

Still referencing FIG. 3, the schematic diagram illustrates an overview of one embodiment of the apparatus of this method. In this schematic diagram, the substrate 300 which can be rigid or flexible glass sheets or flexible metallic or plastic sheets can be conveyed on a conveyer (or a belt) 301 to the deposition zone where vapor flows towards the substrate 300 on which vapor condenses to form a film. Unless mentioned otherwise, in this method, a layer of NaF (less than 500 Å) is deposited on substrate 300. The housing 302 can be heated to maintain the material in its vapor phase until it condenses on the substrate 300. This heated chamber 303 can be controlled, monitored and maintained to the required temperature and is referred to herein as the "controlled environment". The load locks 304, 305 are means to load/unload the substrate using a conveyer 301. In addition, a vacuum pump 307 can maintain the proper pressure within the chamber 303. The heating tube and distribution assembly (HTDA) 306 is configured in such a way to deliver vapor to the substrate. The heating tube of the HTDA 306 can be made from Silicon Carbide (SiC). The distribution assembly of HTDA 306 can be made from different materials (examples include Mullite, Graphite, Ceramic, SiC, etc.)

Further, this invention also discloses a method for making CuInGaSe2 (CIGS) thin films on a substrate which can be glass (rigid or flexible), metallic sheets or plastic sheets (e.g. Polyimide).

Figure 4:
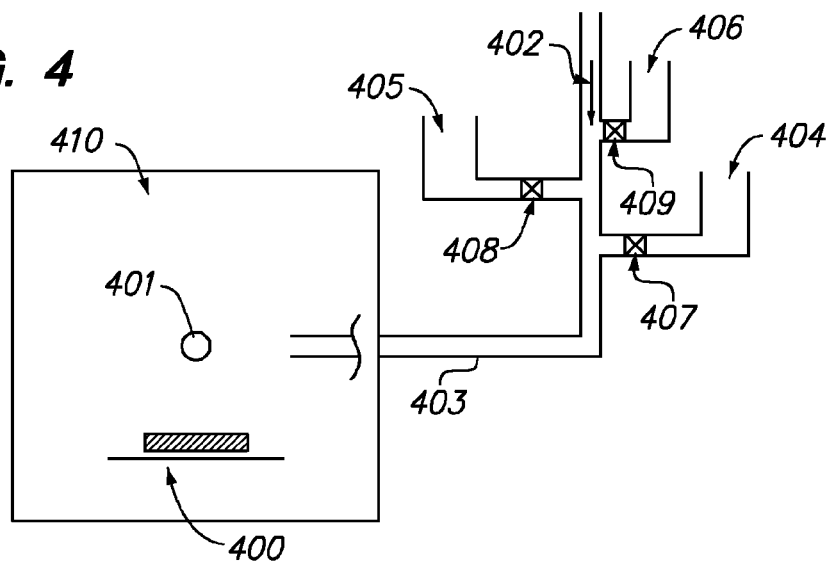
FIG. 4 is a schematic diagram illustrating a deposition system for depositing CIGS thin films on substrate 11.

Referring to FIG. 4, the schematic diagram illustrates the method for making CIGS thin films on a substrate 400, comprised of 102/101/100. The heating tube and distribution assembly (HTDA) 401 can have different designs and structures. The carrier gas 402 is delivered through the feeder tube 403. Source material 404, source material 405, and source material 406 are controlled by valve 407, valve 408, and valve 409, respectively. The source material 404 can be CuInGa (CIG) powder with Cu(In+Ga) ranging from 0.80-1.0 and Ga/(In+Ga) ratio ranging from 0-1. The source material 405 can be Selenium (Se) powder. The purpose of valve 407 and valve 408 is to allow the passage of material when opened and prevent the passage of the material when closed. The carrier gas 402 is to assist in directing the powder into the heating tube 401. In other words, the carrier gas 402 and the CIG powder will be directed to the heating tube 401 that is heated to a temperature capable of heating the CIG powder and vaporizing it. To control the amount of powder coming from the source materials 404, 405, and 406, a rotating screw or a vibratory feeder can be used. The heating tube 401 can be made of Silicon Carbide (SiC) and can be heated using electrical resistive heating. In this heating method, the ends of the heating SiC heating tube 401 (which is a good conductor) can be connected to an electrical power source which causes current to flow in the tube causing it to heat. Alternatively, the SiC heating tube 401 can be heated using Infra-Red (IR) heating or RF and Microwave and RF heating (EMH). SiC is a very good absorber of EMH and therefore heating the heating tube 401 using EMH can be advantageous in this case as disclosed by Abushama in provisional patent application No. 61/773,984. The heating tube and distribution station 401 and the substrate 400 are housed in the housing 410; which is controlled and monitored (referred to as "Controlled Environment"). A number of approaches and designs can be used to achieve heating/vaporizing the material to be deposited and maintaining it in vapor phase, and then directing it towards the substrate 400 for deposition.

Figure 5:
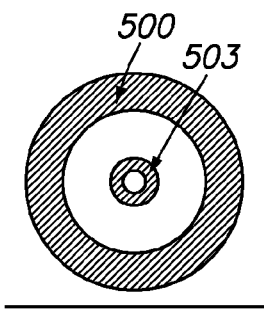
FIG. 5 is a schematic diagram illustrating cross sectional top view of a tubular design of the heating tube and vapor distribution station.
Figure 6:
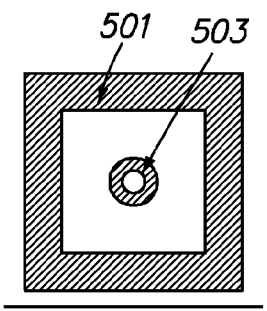
FIG. 6 is a schematic diagram illustrating cross sectional top view of a rectangular design of the heating tubes and vapor distribution stations.
Figure 7:
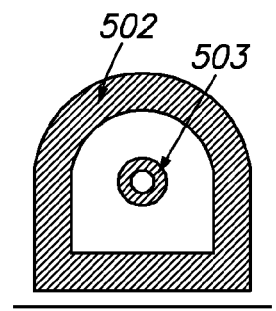
FIG. 7 is a schematic diagram illustrating cross sectional top view of a hemicylindrical design of the heating tubes and vapor distribution stations.

In one embodiment, referring to FIG. 5, FIG. 6 and FIG. 7, the schematic diagrams illustrates a cross sectional top views of a tubular 500, rectangular 501, and hemicylindrical 502 designs of the heating tubes, and feeder tubes 503. These are just examples and this invention extends to other shapes and structures.

Referring back to FIG. 4, the heating tube 401 is then housed in another chamber which can be another tube made from the same or another material. Furthermore, the heating tube is penetrable by the vapor and carrier gas 402 but not by the powder. The heating tube 401 and distribution assembly (HTDA) can be heated to a temperature ranging from 50-2000° C. depending on the material to be vaporized. The carrier gas 402 can be Helium, Nitrogen, Neon, etc. Once the CIG powder/carrier gas are fed through the feeder tube 403 into the heating tube 401, then CIG starts vaporizing. Once in the heating tube 401, CIG powder vaporizes and forms a mix with the carrier gas 402 until the target mix between the two is achieved. The temperature of the heating tube 401 and distribution station is monitored by thermocouples and thermowells. The vapor to carrier gas 402 ratio is crucial in achieving uniform and good deposition on the substrate 400. To prevent the back flow of CIG powder/gas into the feeder tube 403, the flow of carrier gas 402 is kept at a rate that is capable of keeping the CIG vapor and powder inside the heating tube 401. Since the heating tube 401 is penetrable, then vapor/carrier gas mix can be directed towards the substrate 400 to form a CIG precursor on the substrate 400.

Referring to FIG. 5, in case a tubular heating tube 500 is used, the vapor/carrier gas mix can penetrate the lower side of the permeable tube through which vapor will stream out towards the substrate causing deposition of CIG vapor on the substrate. This tubular design of the heating permeable tube achieves more uniform deposition on a moving substrate compared with a stationary substrate. The other two designs in FIGS. 6 and 7, rectangular and hemicylindrical heating tubes 501 and 502, respectively, both have rectangular lower sides which can also achieve uniform deposition on a moving or stationary substrate. In this case, the heating tubes are permeable to vapor/carrier gas but not to powder. The CIG vapor will penetrate the lower side of the heating SiC porous tube towards the substrate. Typically, the substrate is heated using another heating circuit independent from the one that heats the heating tube and the heated chamber. The heating method can be electrical resistive heating, IR heating, or EMH as mentioned above. The substrate temperature is lower than that of the distributing side of the heating tube so that CIG vapor condenses on the substrate. The desired thickness of the CIG precursor can be achieved by controlling the speed of the substrate (in case it's moving), the substrate temperature and the pressure in the processing chamber. The CIG thickness is preferably less than 2.5 μm.

To selenize the metallic CIG precursor and convert it into a CIGS thin film, Se powder is placed in source material 405. Valve 408 needs to be opened and Valve 407 and valve 409 need to be closed, referring to FIG. 4. The Se powder is fed through the feeder tube 403 into the heating tube 401, along with the carrier gas. Once in the heating tube, Se powder vaporizes and forms a mix with the carrier gas until the target and optimal mix between the two is achieved. The vapor to gas ratio is crucial in achieving uniform and good deposition on the substrate. This target mix between Se vapor and the carrier gas can achieve the best selenization. Se vaporizes at lower temperatures compared with CIG. Therefore, the heating tube and the distribution assembly need to be kept at lower temperature compared to CIG. Typically, the substrate temperature in this case is 300-800° C., and the temperature for the Distribution Assembly is in the range of 400-800° C.

In the above procedure, NaF has been included as a layer deposited by PVD on substrate structure 400. Alternatively, NaF can be introduced using source material 406 using NaF powder. In this case, NaF can be introduced before CIG or after CIG or after Se. Moreover, NaF can be introduced simultaneously with CIG or with Se. As an example, post the CIG deposition, Valve 409 can be opened with Valves 407 and 408 closed so that NaF powder can be directed towards the heating tube 401. Once in the heating tube 401, NaF vaporizes and mixes with the carrier gas until an optimal NaF vapor/carrier gas ratio is achieved. The NaF-vapor/carrier gas mix can then be directed towards the lower side of the permeable heating tube 401 for streaming out towards the substrate. The processing temperature, pressure and the speed of the substrate (if moving) can be used to determine the amount of the NaF deposited. Typically, a small amount is need (less than 500 Å).

In another embodiment, a second heating tube station that is fully isolated from the first one can also be used for Se to avoid cross contamination during Se vaporization. In other words, independent HTDAs can be used, one for CIG and another one for Se. This can be applied on both a stationary or moving substrate.

Another procedure to form CIGS is to open the two valves 407 and 408 as shown in FIG. 4 at the same time. In this case, CIG powder and Se powder will be directed into the heating tube for vaporization. Since CIG vaporization temperature is higher than Se vaporization temperature, then the heating tube 401, referring to FIG. 4, needs to be heated to the temperature that is capable of vaporizing CIG powder which will be more than enough for vaporizing Se powder. In this case both Se and CIG powder will vaporize in the heating tube and mix with the carrier gas. The mixing ratio between the vapors and the carrier gas is important to achieve good and uniform deposition on the substrate. The gas/vapor mix will then form in the heating tube 401 and be directed towards the lower side of the permeable heating tube which faces the moving or stationary substrate for deposition of the CIG and Se to form CIGS. At a temperature ranging from 300-800° C., CIGS forms in the heating tube as well. The heating tube temperature can then be increased to a temperature capable of vaporizing CIGS and therefore, the CIGS vapor will penetrate the lower side of the tube for deposition of a CIGS thin film with a thickness less than 5 μm. In this procedure, NaF has been included as a layer deposited by PVD on the substrate structure 400.

Alternatively, NaF can be introduced using source material 406 using NaF powder. In this case, NaF can be introduced before CIG/Se or after CIG/Se or simultaneously with CIG/Se. As an example, post the CIG deposition, referring to FIG. 4, Valve 409 can be opened with Valves 407 and 408 closed so that NaF powder can be directed towards the heating tube 401. Once in the heating tube 401, NaF vaporizes and mixes with the carrier gas until an optimal NaF-vapor/carrier gas ratio is achieved. The NaF-vapor/carrier gas mix can then be directed towards the lower side of the permeable heating tube for streaming out towards the substrate 400. The processing temperature, pressure and the speed of the substrate 400 (if moving) can be used to determine the amount of the NaF deposited. Typically, a small amount is needed (less than 500 Å). Once NaF doping is completed, then Se deposition can start as explained above.

In another embodiment, another procedure to achieve forming a CIGS thin film using the above method and apparatus is to use CIGS powder in source material 404. Valve 407 can be opened, but Valve 408 and Valve 409 in this case remains closed. Using a rotary screw or a vibratory feeder, and the flow of the carrier gas 402, the CIGS powder will be directed towards the heating tube 401 to be heated and vaporized. Once CIGS powder vaporizes and mixes with the carrier gas 401, then vapor starts streaming out from the lower side of the permeable heating tube 401 (which can be made of SiC) towards the substrate 400 for deposition of CIGS film. The substrate 400 in this case is heated to a temperature in the 400-800° C. range (preferably, 500-600° C.), while the distribution chamber 410 is heated to a temperature higher than the substrate 400 in the 500-2000° C. range to keep the CIGS in vapor phase. Since the substrate 400 temperature is lower than the distribution assembly temperature, then CIGS vapor condenses on the substrate 400 forming CIGS film. The speed of the substrate 400, its temperature and the pressure of the processing chamber determines the thickness of the film which can be less than 5 μm. The substrate 400 can then be taken out using the conveyer for further processing into completed CIGS solar cells as shown in FIG. 1. In this procedure, NaF has been included as a layer deposited by PVD on the 102/101/100 substrate structure. Alternatively, NaF can be introduced using source material 406 using NaF powder as described above.

In yet another embodiment, another procedure for making CIGS thin films is disclosed which uses (In,Ga)2Se3 powder as source material 404 and CuxSe as source material 405, referring to FIG. 4. The Cu/(In+Ga) in the final CIGS film should be in the 0.80-1.0 range and the Ga/(In+Ga) ratio should be in the 0-1 range. (In,Ga)2Se3 powder can be placed in source material 404 where the valve 407 can then be opened. Carrier gas valve can also be opened. The (In,Ga)2Se3 powder will be directed using the carrier gas feeder tube 403 (which can be made from Mullite or another ceramic) into the heating tube 401. The heating tube 401 can be made from SiC. Once (In,Ga)2Se3 powder reaches the heating tube 401, the distribution chamber is heated to temperatures in the range 200-2000° C., and the substrate 400 is heated to a temperature in the range of 400-800° C., the (In,Ga)2Se3 starts vaporizing and forming a mix with the carrier gas 402. This mix can penetrate the lower side of the permeable tube towards the substrate 400 for deposition on the substrate 400. The speed of the substrate 400, the pressure of the processing chamber, and the temperature of the substrate 400 shall determine the thickness of the film to be deposited. The thickness of the (In,Ga)2Se3 layer deposited on the substrate 400 is less than 2.5 μm. To deposit CuxSe, Valve 407 and 409 can be closed, and Valve 408 can be opened. The carrier gas 402 stays flowing to direct the CuxSe powder to the heating tube 401. The heating SiC tube can be heated to the CuxSe vaporization temperature (400-1000° C.) using one of the heating methods mentioned above (electrical heating, IR heating or RF/Microwave heating). Once CuxSe powder is in the heating tube 401, then it vaporizes and forms a mixture with the carrier gas 402. This mixture then penetrates the lower porous side of the permeable heating tube 401 towards the substrate 400. The substrate temperature is 400-700° C. (preferably 500-800° C.), whereas, the distribution assembly is at higher temperature (500-700° C.). Therefore, the CuxSe vapor condenses on the substrate 400 and reacts with the already formed (In,Ga)2Se3 layer to form chalcopyrite CIGS phase of a thickness less than 5 μm. The substrate 400 can now be conveyed outside the processing chamber using the unloading lock as shown in FIG. 3 for further processing into a complete CIGS thin film solar cell. In this procedure, NaF has been included as a layer deposited by PVD on the 102/101/100 substrate structure. Alternatively, NaF can be introduced using source material 406 using NaF powder as described above.

All the above procedures for depositing CIGS thin films use an apparatus similar to the one shown in FIG. 4.

In yet another aspect of the invention, the deposition apparatus can be altered in such away to accommodate more materials sources as shown in FIG. 68.

Referring to FIG. 68, the heating tube and distribution assembly (HTDA) is similar to the one shown in FIG. 4. The heating tube 601 can be made of SiC and heated using resistive electrical heating, IR heating or RF/Microwave heating to a temperature that is capable of vaporizing the material to be deposited. The heated chamber 602 which encloses the controlled environment can be heated using one of the heating methods described above to a temperature in the range of 200-2000° C. The temperature of the heated chamber 602 is capable of keeping the vapor phase from the moment it is formed until it condenses on the substrate 600 or reacts with another material that has already been deposited on the substrate 600. The substrate 600 can be conveyed to a position underneath the deposition station and heated using one of the heating methods mentioned above (i.e. resistive heating, IR heating, or RF/Microwave heating). The feeder tube 603 feeds powder into the heating tube 601 so that the heating tube heats the powder and vaporizes it. The vapor generated in the heating tube mixes with the carrier gas 604 until it forms the optimal vapor/carrier gas ratio. The vapor/gas mix is then directed to the lower side of the SiC heating permeable tube in use. The heating tube 601 can be a tubular, rectangular or semi-cylindrical heating tube as shown in FIG. 5, FIG. 6 and FIG. 7.

Moreover, this invention discloses another method for depositing CIGS thin films on a substrate 600 (rigid glass, flexible glass, metallic sheet or plastic sheet) and conveyed using a conveyer as shown in FIG. 3 to the optimal position under the distribution/deposition station. This substrate structure 600 which is comprised of 102/101/100 can be heated to a temperature in the 400-800° C. range.

Figure 8:
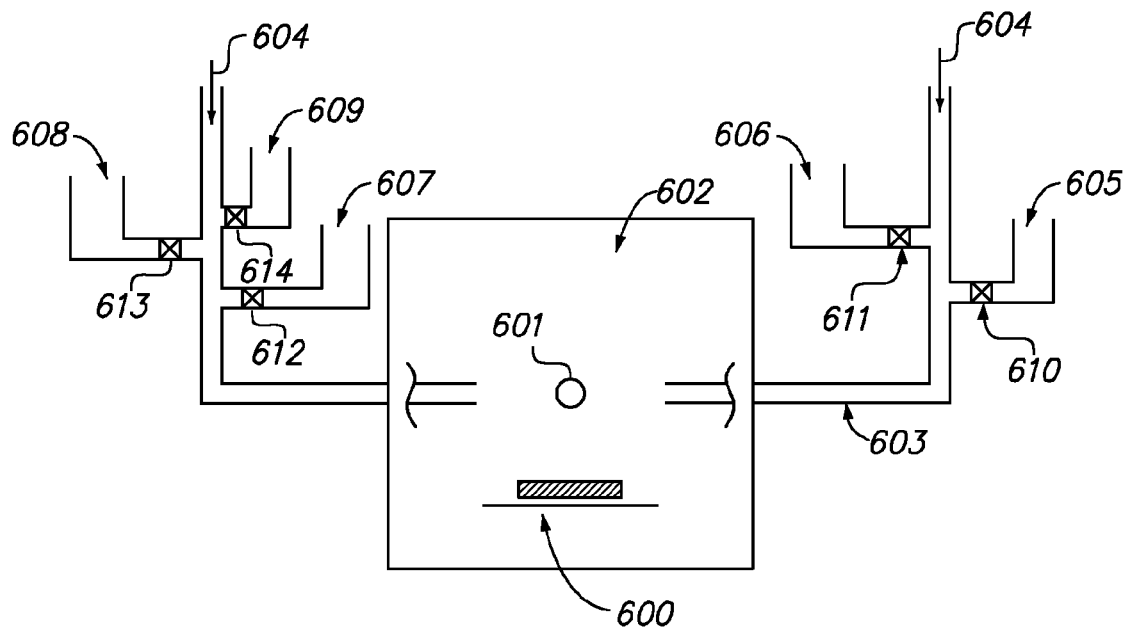
FIG. 8 is a schematic diagram illustrating of a deposition apparatus that is altered in such a way to accommodate more material sources.

Referring to FIG. 8, the sequence of the deposition method presented here is Cu first, followed by In, followed by Ga, followed by Se. Copper (Cu) powder can be placed in source material 605; Indium (In) powder can be placed in source material 606 and selenium (Se) powder can be placed in source material 608. Valves 610, 611 and 613 remain closed. Cu, In and Se have solid phases at room temperature, but Gallium (Ga) has a liquid phase at room temperature. Ga liquid can be placed in source material 607 with Valve 612 closed. This invention also discloses a method of forming Ga powder and placing it in source material 607. Continuous cooling can be applied on source material 607 so that the temperature of source material 607 is low enough to keep Ga in solid phase. The procedure for preparing Ga powder is as follows: Ga can be cooled down, then quickly changed into powder and stored in a refrigerator. In a timely manner, Ga powder can be transferred from the refrigerator to the cooled source material 607 container so Ga remains as powder and in solid phase.

The carrier gas 604 (He, N2, Ne, etc) can be turned on. Valve 610 can be opened with all other valves closed. The feeder tube 603 will then feed Cu powder into the heating tube 601, which can be made from SiC, heated to a temperature capable of vaporizing Cu, using a rotary screw or a vibratory feeder. Once Cu powder is in the heating tube 601 which can be tubular, rectangular or hemi-cylindrical as shown in FIG. 5, FIG. 6 and FIG. 7 respectively, then Cu starts vaporizing and mixing with the carrier gas 604. The Cu vapor/carrier gas mix needs to be at an optimal ratio for best deposition of Cu on the heated substrate 600. The Cu/carrier gas mix is then directed towards the lower side of the permeable porous tube to be directed towards the substrate 600 and then deposited as a Cu layer with a certain target thickness. This target thickness can be achieved using the process temperature, the process pressure and the speed of the substrate 600 in case the substrate is moving.

After the deposition of Cu is completed, then Valve 611 can be opened with other valves closed. In powder source material 604 can be fed into the heating tube 601 using a rotary screw or a vibratory feeder to direct In powder through the feeder tube 603 towards the heating tube 601. Once In is in the heating tube 601 that is heated to a temperature capable of vaporizing In, then In vapor starts forming and mixing with the carrier gas 604 until an optimal In-vapor/carrier gas ratio is reached. The In vapor/carrier gas mix can then be directed towards the lower side of the porous heating tube made from SiC to be streamed down towards the substrate 600 which already has a Cu layer deposited on it. In thickness target can be achieved using the process temperature, the process pressure and the speed of the substrate 600 in case the substrate is moving. Post In deposition on the substrate 600, two elements have been deposited: Cu and In. This allows the formation of CuxIny (with x and y greater than 0 and less than 1) phases. It is likely that elemental Cu and In to be present as well.

For Ga deposition, Valve 612 which is connected to Ga source that is cooled down to a temperature capable of keeping Ga in solid phase (powder) can be opened. A rotary screw or a vibratory feeder can be used to direct Ga powder through the feeder tube 603 towards the heating tube 601 which can be made from SiC and heated to a temperature capable of vaporizing Ga. Once Ga starts vaporizing, Ga vapor starts mixing with the carrier gas 604 until an optimal ratio of Ga vapor/gas is reached. The Ga-vapor/carrier gas mix is then directed towards the lower side of the permeable tube through which the Ga-vapor/carrier gas mix is streamed down towards the substrate 600 for deposition. The streaming down of Ga-vapor/carrier gas mix continues until Ga thickness target is achieved. Controlling Ga thickness can be achieved by controlling the process temperature, the process pressure and the speed of the substrate 600 in case it is moving. Post Ga deposition, three elements are deposited and the substrate 600 is likely to have a Cu(In,Ga) phase in addition to elemental phases.

For Se deposition, Valve 613 can be opened with other valves closed. Se powder is fed through the feeder tube 603 to the heating tube 601 which has already been heated to a temperature capable of vaporizing Se. Once Se vapor is directed to the heating tube 601, it vaporizes. Se vapor starts mixing with the carrier gas 604 until an optimal ratio of Se vapor/carrier gas is reached. This mix can then be streamed down to the lower side of the heating permeable and porous tube through which the Se/carrier gas mix can be streamed down towards the substrate 600 (which is heated to a temperature in the 400-800° C.) for deposition. Se vapor then arrives at the substrate 600 and reacts with the already existing phases (Cu(In,Ga), Cu, In, Ga) forming CIGS thin film of a thickness less than 5 µm.

This invention also presents a new method for doping CIGS with Sodium. Na is an important dopant for CIGS. In all embodiments above, NaF can be introduced as a separate layer on top of the 102 layer (which can be a refractory metal like Mo, W, etc.). NaF can be used as the source material and the external layer can be deposited by PVD. NaF can also be deposited at any location between the layers described in all above embodiments. Alternatively, the apparatus depicted in FIG. 8 can be used for NaF doping. NaF powder can be placed in source material 609. Valve 614 can be opened with other valves closed. NaF powder can be directed through the feeder tube 603 which can be made of Mullite or another ceramic towards the heating tube 601. NaF can be introduced before Cu deposition, after Cu deposition, after In deposition, after Ga deposition, or after Se deposition. It can also be introduced at the same time with Cu, or In, or Ga, or Se. Typically, NaF thickness is less than 500 Å.

This invention also depicts another method for depositing CIGS. All possible alterations of Cu, In, Ga, Se and NaF can be used. For example, (In, followed by Ga, followed by Se), followed by (Cu, followed by Se), followed by (In, followed by Ga, then followed by Se). The heating tube 601, the heating chamber 602 (controlled environment) and the substrate 600 need to be heated to the adequate temperatures. An optimal vapor/carrier gas mix needs to be achieved.

Another sequence is (Cu, followed by Se), then (In, followed by Ga, followed by Se); or vice versa. Again, the heating tube, the heating chamber (controlled environment) and the substrate need to be heated to the adequate temperatures. An optimal vapor/carrier gas mix needs to be achieved.

Figure 9:
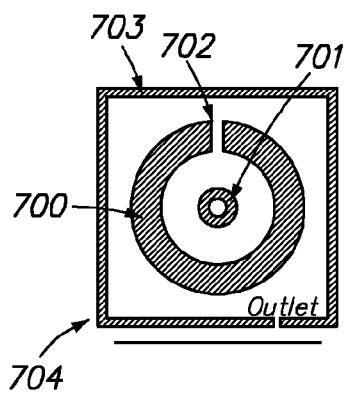
FIG. 9 is a schematic diagram illustrating cross sectional top view of another structure for a tubular design of the heating tube and vapor distribution assembly.
Figure 10:
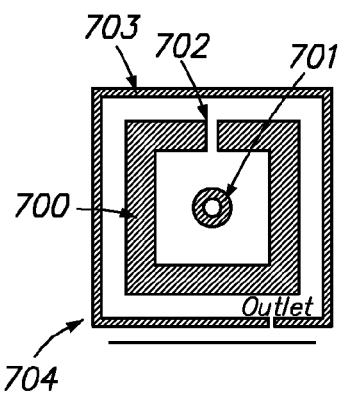
FIG. 10 is a schematic diagram illustrating cross sectional top view of another structure for a rectangular design of the heating tube and vapor distribution assembly.
Figure 11:
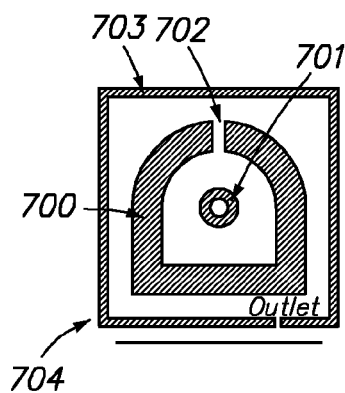
FIG. 11 is a schematic diagram illustrating cross sectional top view of another structure for a hemicylindrical design of the heating tube and vapor distribution assembly.

Referring to FIG. 9, FIG. 10, and FIG. 11, this invention also discloses several structures for designing the heating tube and distribution assembly. The heating tube 700 and distribution assembly is placed inside a sleeve 703 that can be made from impermeable ceramic material that is adequate to achieve the required temperature and has the appropriate thermal properties to keep the material vaporized until the vapor/carrier gas mix is streamed out to the substrate 704 through the lower side of the sleeve 703 and be deposited on the heated substrate which is conveyed in an optimal position under the vapor dispensing part of the sleeve 703 which has a number of outlets (e.g. 1-1000) that passes vapor/carrier gas mix towards the substrate as shown in FIG. 9, FIG. 10, and FIG. 11. This configuration of the heating tube 700 and distribution assembly allows more time for the vapor and carrier gas to mix. Since the path the vapor/carrier gas mix needs to travel is longer in this case, it is more likely to have a more purified vapor/carrier gas mix so that powder particles are not deposited on the substrate 704. The heating tube 700 can be formed from impermeable SiC so that the vapor/carrier gas mix is directed through the opening towards the sleeve 703 for better vapor/carrier gas mixing. This method also makes the vapor/carrier gas mix clean of any solid powder particles that may make it to the substrate and degrade the material properties of the material to be deposited, and cause device degradation. The heating tube and distribution assembly shown in FIG. 9, FIG. 10, and FIG. 11 above can be used with heating the powder material and dispensing the vapor/carrier gas mix towards the substrate 700.

Referring to FIG. 4 and FIG. 9, FIG. 10, and FIG. 11, the heating tube 401 (made from impermeable SiC) and distribution assembly can be any one shown in FIG. 9, FIG. 10, or FIG. 11. CuInGa powder is placed in material source 404, Se powder is placed in material source 405 and NaF powder is placed in material source 406. Valve 407 can be opened to direct the CIG powder towards the heating tube which is heated to the adequate temperature that is capable of vaporizing CIG powder. Once the CIG powder is in the heating tube 401, it starts vaporizing and mixing with the carrier gas. The vapor/carrier gas mix is then directed towards the sleeve 703 for better mixing. Since the path the vapor/carrier gas needs to travel is longer, then vapor/carrier gas will be clean from any CIG powder particles. The vapor/carrier gas mix is then directed by the sleeve 703 which is made from an impermeable ceramic material towards the outlets at the lower side of the sleeve that faces the substrate to be streamed out on the substrate structure 704 which is comprised of 102/101/100 as shown in FIG. 1. The substrate 100 can be glass (rigid or flexible, metallic sheet or plastic sheet). The CIG will be directed towards the substrate 704 which is placed in an optimal position underneath the lower side of the sleeve. A precursor CIG layer will then form on the substrate 704 which has been heated to a temperature of 400-800° C. and kept at an optimal distance from the outlets side of the sleeve. For Se (still referencing FIG. 4 and FIG. 9, FIG. 10, and FIG. 11), Valve 408 needs to be opened with Valves 407 and 409 closed, and Se powder will then be directed towards the heating tube and the distribution assembly 701 through the feeder tube 403 using a rotary screw or a vibratory feeder. The heating tube can be made of SiC and can be heated to a temperature that is capable of keeping Se vaporized in the heating tube and the distribution assembly. Se vapor will then start mixing with the carrier gas until an optimal ratio is achieved. The Se-vapor/carrier gas mix will then travel through the opening 702 as shown in FIG. 9, FIG. 10, and FIG. 11 towards the impermeable sleeve 703 to be directed towards the outlets side of the sleeve with outlets that are in opposite direction compared with the opening in the heating tube 701. The Se-vapor/carrier gas mix will then be streamed out the outlets in the lower side of the sleeve 703 towards the heated substrate structure 704 which is comprised of 102/101/100. Substrate 100 can be glass (rigid or flexible), metallic sheet or plastic sheet. Se will then arrive at the surface and reacts with the already formed CIG precursor to form CIGS with Cu/(In+Ga) and Ga/(In+Ga) ratios in the range of 0.7-1.0 and 0-1, respectively. The thickness of the CIGS thin film is less than 5 μm. The CIGS thin film on substrate structure 704, which is comprised of 102/101/100 can then be processed into complete solar cell as shown in FIG. 1.

For NaF doping, NaF can be placed in source material 609 as shown in FIG. 8. Na doping is typically less than 2% and can be introduced in the above embodiment before or after the CIG deposition, or after Se deposition. It can also be introduced simultaneously with either CuInGa or Se deposition. Same doping procedure for NaF explained above can be implemented in this case as well.

Different alterations of the heating tube design and the distribution assembly can be achieved such that an optimal vapor/carrier gas ratio is achieved; a clean vapor/carrier gas mix (a mix that does not have powder solid phase of the material) can be achieved; and a uniform and appropriate streaming out of the vapor/carrier gas through the distribution assembly can be achieved.

Referring again to FIG. 9, FIG. 10, and FIG. 11, in one embedment, a filter can be used in the opening 702 of the heating tube to filter the vapor/carrier gas mix so that the vapor and the carrier gas mix passes through the filter but the powder does not.

In another embodiment of the invention, the heating tube 700 (tubular, rectangular or semi-cylindrical) can be impermeable and can be placed inside another tube which is permeable and both can be placed inside a third tube which can be impermeable. The middle tube in this case will function as a membrane to purify the vapor/carrier gas mix from any powder. A width varying slit-like slot can be opened at the lower side of the outer tube to stream out the vapor/carrier gas mix towards the substrate. Alternatively, a number of outlets can be punched in the lower end of the outer tube. In another alternative, a separate conduit can be assembled in the lower side of the outer tube in which the outlets are punched through the lower side of the conduit. In another embodiment, the sleeve 703 can be shrouded with a narrow tube that confines the sleeve and extends all the way towards the lower side of the sleeve at which point this tube extends horizontally above the substrate 704 with a number of outlets for streaming out the vapor/carrier gas mix.

In another embodiment, the substrate 704 can be faced downward instead of upward. This configuration can be achieved using certain designs that employ certain gas to float the substrate 704 into the processing zone, at which point the heating tube and distribution assembly are designed to achieve uniform deposition on the substrate which can be made of glass, metallic sheet or plastic sheet. All embodiments for deposition procedures described above can be applied on a facing-down substrate.

The above deposition procedure can be used to deposit the other layers shown in FIG. 1, including: the buffer layer 104 (e.g. CdS. ZnS, In2S3, In2Se3, etc), the i-ZnO/[(ZnO:Al), or ITO] layer 105, metallic grids/AR layer 106. In addition, the above method and apparatus can also be used to deposit the back contact layer 101 or the barrier layer 102. All these material can be formed into powder and fed into an apparatus similar to the one shown in FIG. 8 above for vaporization and deposition.

This invention also presents a new apparatus and method for depositing CIGS thin film on a substrate using the concepts and embodiments described above. Approach I above describes the growth details of the three stage process. Typically, this process is usually implemented in a bell jar system and yielded the state-of-the-art conversion efficiency of greater than 20.0%. Although this process yields high quality CIGS semiconductor material and CIGS thin solar cells, it has proven difficult and costly to scale up. This invention presents a new method and apparatus that implement the three stage process in a way that is cost effective. This new approach will be referred to as the "three step process". This method employs five heating and distribution stations independent from each other. These heating and distribution stations are capable of vaporizing Cu, In, Ga, Se and the dopant NaF. The heating tubes are made of impermeable SiC. In one embodiment of this invention, all five heating tubes and distribution stations are enclosed in the heated chamber (controlled environment) which can be heated to a temperature from ambient to 2000° C. Five heating tubes and distribution assemblies are enclosed within the heating chamber. Each heating and distribution station is comprised of two impermeable tubes. The outer impermeable tube can be made of impermeable ceramic or impermeable graphite. The heating tube can be made of SiC. The lower side of the outer impermeable tube can have a number of outlets to stream out the vapor/carrier gas mixture (1-1000).

Figure 12:
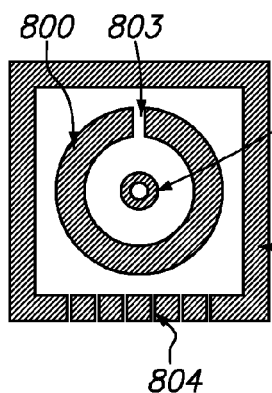
FIG. 12 is a schematic diagram illustrating cross sectional top view of yet another structure for a tubular design of the heating tube and vapor distribution assembly, wherein the outer tube is made of an impermeable material and shrouds a conduit for vapor/carrier gas transport.

Referring to FIG. 12, 13, 14, the schematic diagrams illustrate three designs for the heating tube and the distribution station. Similar to the heating tube and distribution station in FIG. 9, FIG. 10, and FIG. 11, the heating tube and distribution station comprise of the heating tube 800, outer tube 801, feeder tube 802, heating tube opening 803, and outlets 804.

Figure 15:
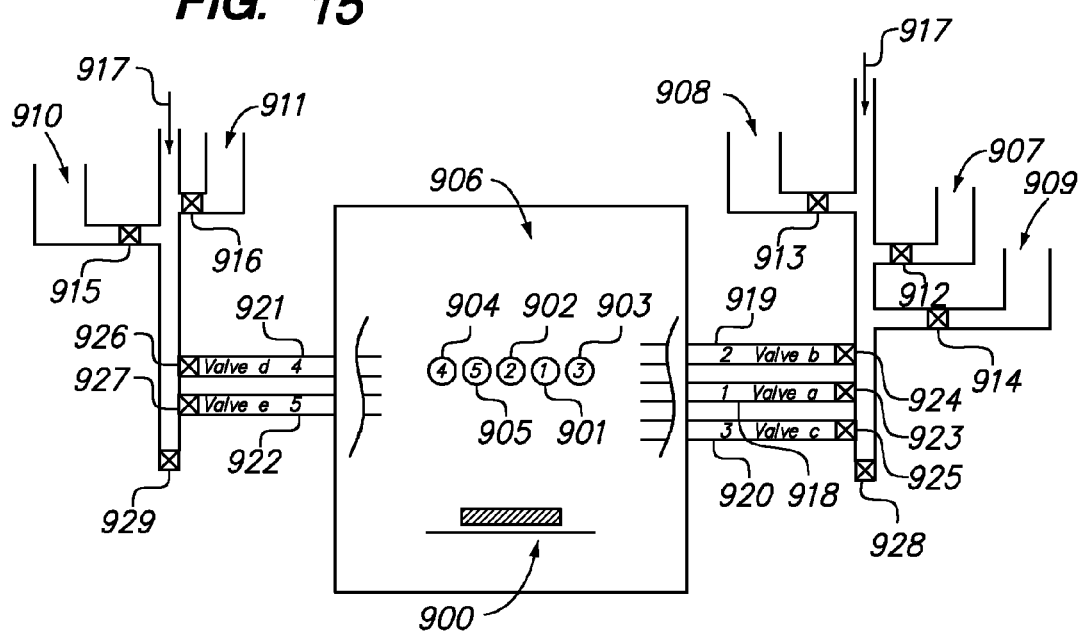
FIG. 15 is a schematic diagram illustrating an apparatus for forming CIGS thin film using a three-step process, wherein the apparatus consists of five independent heating tubes and vapor distribution stations.

Referring to FIG. 15, the schematic diagram illustrates an apparatus for forming CIGS thin films on a substrate structure 900 which is comprised of 102/101/100 as shown in FIG. 1. Substrate 100 can be glass (rigid or flexible), metallic sheets or plastic sheets. 101 can be SiO2 or any other material and 102 can be Mo, W, Ti, Ta, etc. Substrate structure 900 can be conveyed into the processing chamber using a conveyer 301 as shown in FIG. 3. Substrate structure 900 can then be positioned underneath the distribution assembly in an optimal position on a stage that is capable of rotation. The stage is also capable of moving back and forth and left and right. The distance between the substrate structure 900 and the distribution assembly can range from 1 mm to 20 cm. The heating tubes 901, 902, 903, 904, and 905 can be made of impermeable SiC. The outer tube can be made of impermeable material as Mullite, graphite or ceramic. The heated chamber 906 (controlled environment) can be heated using resistive heating, IR heating or RF/Microwave heating. The heating tubes 901, 902, 903, 904, and 905 can be heated using resistive heating, IR heating or RF/Microwave heating. All heating circuits for the five heating tubes 901, 902, 903, 904, and 905 and the heated chamber 906 are independent. So, each heating tube 901, 902, 903, 904, and 905 has its own heating circuit which does not interfere with the heating circuits of the other heating tubes and/or the heating circuit of the heated chamber 906. Temperature for each circuit can be controlled independently using thermowells.

Still referring to FIG. 15, source materials 907, 908, 909, 910, and 911 can be Cu, In, Ga, Se and NaF in powder forms, respectively. Source material 909 for Ga is cooled down to keep Ga in powder solid form. There are five heating tubes and distribution assemblies (HTDA) 901, 902, 903, 904, and 905 for Cu, In, Ga, Se and NaF, respectively. Directing the flow of powder into the respective HTDA 901, 902, 903, 904, and 905 can be achieved using the respective valves. Following is a description of using the apparatus and the 3-step process described above to form CIGS thin films with Cu/(In+Ga) and Ga/(In+Ga) ratios ranging from 0.80-1.0 and 0-1, respectively, and a total thickness of less than 5 µm.

a. Source materials 907, 908, 909, and 910 can be Cu, In, Ga and Se in powder forms, respectively. Carrier gas source 917 can be opened.

b. Step 1 [(In,Ga)2Se3-IGS]deposition: In, Ga and Se powders can be fed into heating tubes 902, 903 and 904 from source material 908, 909 and 910 using rotary screws or vibratory feeders and the flowing pressure of the carrier gas 917. Carrier gas 917 source can be opened and remains open. To direct In powder into heating tube 902 through feeder tube 919, Valves 913 and 924 can be opened with all other valves closed. Valve 928 can be opened after In deposition is completed for short time with the carrier gas flowing to clean the channel from any In powder. After that, Valve 928 needs to be closed. To direct Se powder into heating tube 904 through feeder tube 921, Valves 915 and 926 can be opened, with all other valves closed. To direct Ga powder into heating tube 903 through feeder tube 920, Valves 914 and 925 can be opened with all other valves closed. The carrier gas can be He, Ne, N2, etc. and the flow rate can be adjusted for an optimal value. In, Ga and Se powders are directed to heating tubes 902, 903, and 904 for vaporization. All three heating tubes are then heated to adequate temperatures using independent heating circuits. The heating method can be resistive, IR or RF/Microwave heating. The temperatures for heating tubes 902, 903, and 904 are capable of vaporizing In, Ga and Se, respectively. Once In, Ga and Se vaporize, they start mixing with the carrier gas 917 (each in its own independent distribution assembly) and flowing into the respective distribution assembly which is impermeable and has a number of holes on its lower side to stream out the vapor/carrier gas mix for deposition on the substrate 900 which is heated independently to a temperature in the 200-800° C. range. The process needs to be timed in such a manner that In-vapor/carrier gas, Ga-vapor/carrier gas and Se-vapor/carrier gas are directed towards the lower side of the outer tube at the same time. The vapors/carrier gas mixtures of the three materials can be streamed out towards the substrate which is heated to a temperature of 200-800° C. for (In,Ga)2Se3 (IGS) deposition. IGS thickness can be less than 2.5 µm. To achieve uniform deposition and optimal composition, the substrate can be set in rotation, and moved in different directions.

c. Step 2 (Cu2-xSe deposition): After completion of step 1 above, Valves 912 and 923 can be opened with all other valves closed so that Cu powder can be fed through feeder tube 918 into heating tube 901 using a rotary screw or a vibratory feeder. Se powder can be fed into heating tube 904 as described in point b above. Heating tubes 901 and 904 can be heated independently to temperatures adequate for vaporizing Cu and Se powders. Cu and Se vapors mix with the carrier gas 917, each in its own HTDA until optimal vapor/carrier mixtures are achieved. Cu-vapor/carrier and Se-vapor/carrier gas mixtures are then directed through openings in heating tubes 901 and 904, respectively towards their respective distribution assemblies which have a number of outlets in their lower sides for streaming out vapor towards the substrate which is kept at a temperature in the 200-800° C. range. The process needs to be timed in such a manner that Cu-vapor/carrier gas and Se-vapor/carrier gas are directed towards the lower side of the outer tube at the same time. To achieve uniform deposition and optimal composition, the substrate 900 can be set in rotation, and moved in different directions.

d. Step 3 (IGS Deposition): After step 2 of the deposition which is described in point c above is completed, CIGS film on the substrate 900 is Cu-rich. Small amounts of In, Ga and Se need to be deposited to bring the CIGS composition into Cu-poor with Cu/(In+Ga) ratio ranging from 0.70-1.0. IGS thickness in this case is about 10% of the overall CIGS thin film thickness. The procedure for depositing IGS is the same as in point b above. The film can then be taken out for further processing into a complete CIGS solar as depicted in FIG. 1.

In the above description of three step process, NaF was already included as a layer deposited on the back contact layer 102. This invention also presents a new doping method for Na. In reference to FIG. 15, NaF can be introduced before or after step 1 or after step 2 or after step3. To introduce NaF, Valves 916 and 927 need to be opened with all other valves closed. NaF powder can then be directed to heating tube 905 for vaporization through the feeder tube 922. Heating tube 905 is heated to a temperature capable of vaporizing NaF.

NaF-vapor/carrier gas will then mix and be directed towards the lower side of HTDA which has a number of outlets for streaming out NaF vapor towards the substrate 900 for doping CIGS. To clean the system from residues, valves 928 and 929 can be opened for a short time and carrier gas flows through.

In another embodiment of the invention, a two step process can also be designed. First, Cu-rich CIGS is grown by depositing Cu, In, Ga and Se. Second, In, Ga and Se are deposited in an amount necessary to bring the Cu-rich CIGS film into Cu-poor composition. The apparatus depicted in FIG. 15 and the procedures described in Method IV above can be used in this case.

The apparatus depicted in FIG. 15 can also be used for other process sequences. These sequences include CuxSe, followed by (In,Ga)2S3 or vice versa.

V. Method 5

Figure 13:
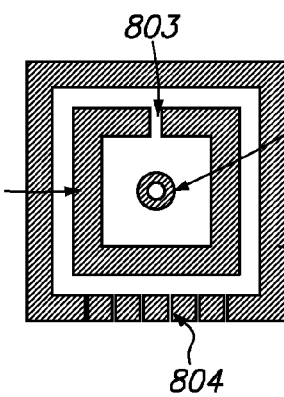
FIG. 13 is a schematic diagram illustrating cross sectional top view of yet another structure for a rectangular design of the heating tube and vapor distribution assembly, wherein the outer tube is made of an impermeable material and shrouds a conduit for vapor/carrier gas transport.
Figure 14:
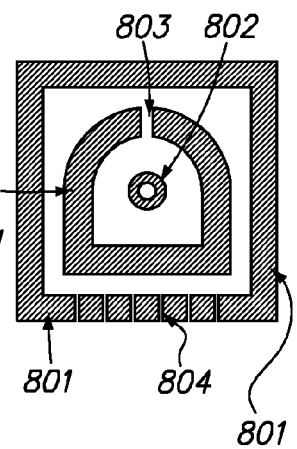
FIG. 14 is a schematic diagram illustrating cross sectional top view of yet another structure for a hemicylindrical design of the heating tube and vapor distribution assembly, wherein the outer tube is made of an impermeable material and shrouds a conduit for vapor/carrier gas transport.
Figure 16:
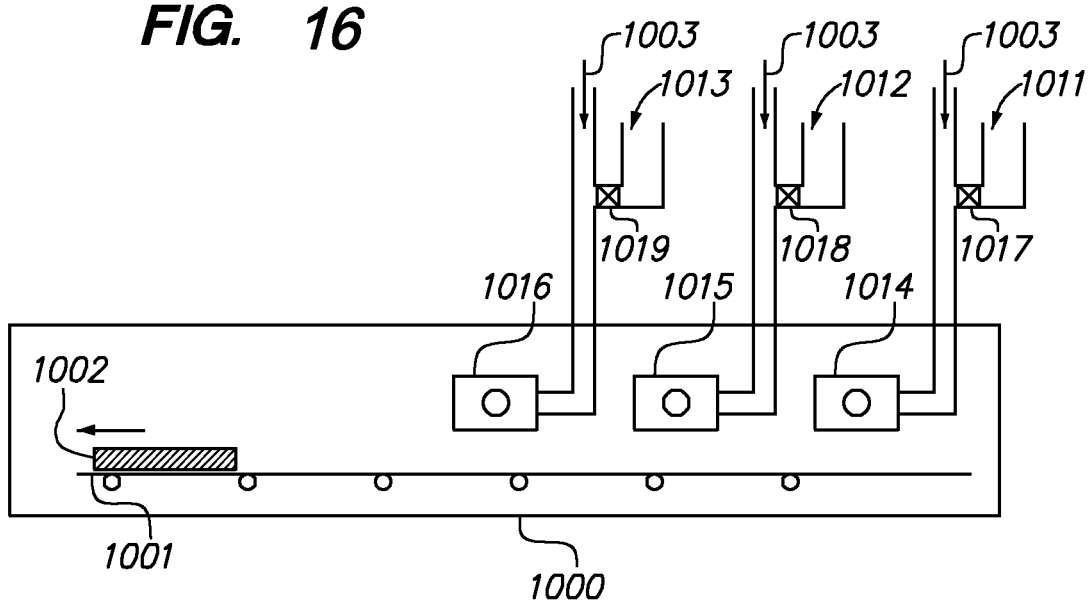
FIG. 16 is an apparatus for depositing CIGS thin films on a moving substrate. This Apparatus can be a roll-to-roll or batch tool or it can be a small lab tool.

In one embodiment, the apparatus and deposition procedures described in Method 4 above can be applied on a moving substrate, which can be a roll-to-roll (R2R) tool for processing flexible sheets including flexible glass sheets (e.g. Corning® Willow™ Glass), flexible metallic sheets, or flexible plastic sheets (e.g. Polyimide); a batch tool for processing non-flexible substrates including rigid glass; or a small lab tool. Each source material can have its own deposition station, and arranged in such a way to deposit the material that needs to be deposited. Referring to FIGS. 10A-10E, the substrate can be rigid or flexible glass sheets (e.g. Corning® Willow™ Glass), or metallic, or plastic sheets, placed on a conveyor 1001. The apparatus in this case can be a roll-to-roll (R2R) tool for processing flexible sheets including flexible glass sheets (e.g. Corning® Willow™ Glass), flexible metallic sheets, or flexible plastic sheets (e.g. Polyimide). The apparatus can also be a batch tool for processing non-flexible substrates including rigid glass. The apparatus can also be a small lab tool. FIG. 16 through 19 depicts an example for such apparatus. Referring to FIG. 16, in one embodiment, a processing chamber 1000 is depicted and comprises three deposition stations and a conveyor belt 1001, which moves the substrate structure 1002 to be placed under the respective station so that the respective material can be deposited. CIG, NaF and Se powders 1011, 1012, and 1013, respectively, can be placed as depicted in FIG. 16. CIG, NaF and Se powders 1011, 1012, and 1013, respectively, can then be directed towards their respective heating tubes 1014, 1015, and 1016, respectively, through their respective feeder tubes by opening their respective valves, 1017, 1018, and 1019, respectively and using rotary screws or vibratory feeders and the flow of the carrier gas 1003. The heating tubes can be made from impermeable SiC. The substrate structure 1002 used here has 101 and 102 layers with no NaF deposited. Any design of the HTDAs shown in FIGS. 5-7, and 9-14 can be used. In one embodiment, referring to FIGS. 12, 13, 14 briefly, each heating and distribution station is comprised of two impermeable tubes. The outer impermeable tube can be made of impermeable ceramic or impermeable graphite or mullite. The heating tubes can be made of SiC and can be heated to an adequate temperature capable of vaporizing the material to be deposited. The lower side of the outer impermeable tube can have a number of outlets to stream out the vapor/carrier gas mixture (1-1000). Referring back to FIG. 16, in one embodiment, Once the CIG powder 1011 is in its heating tube, it starts vaporizing and mixing with the carrier gas 1003 until an optimal ratio is achieved. CIG-vapor/carrier gas mix is then directed towards the lower side of the impermeable outer tube for streaming out through the outlets towards the moving substrate 1002. Because of the moving substrate, CIG thickness needs to be controlled using processing temperature, processing pressure and the speed of the substrate. Once the CIG target thickness is achieved, then the substrate is conveyed towards the NaF doping station, where a small amount of NaF 1012 (less than 500 Å) can be introduced by following the same aforesaid vaporizing and gas mixing procedure. After the NaF doping, the substrate moves to the Se station, where the metallic precursor gets selenized. Timing in this method is crucial. The target thickness for In needs to be controlled in such away to make the Cu/(In+Ga) and the Ga/(In+Ga) ratios in the ranges 0.7-1.0 and 0-1, respectively. The thickness CIGS thin film can be less than 5 μm.

Figure 17:
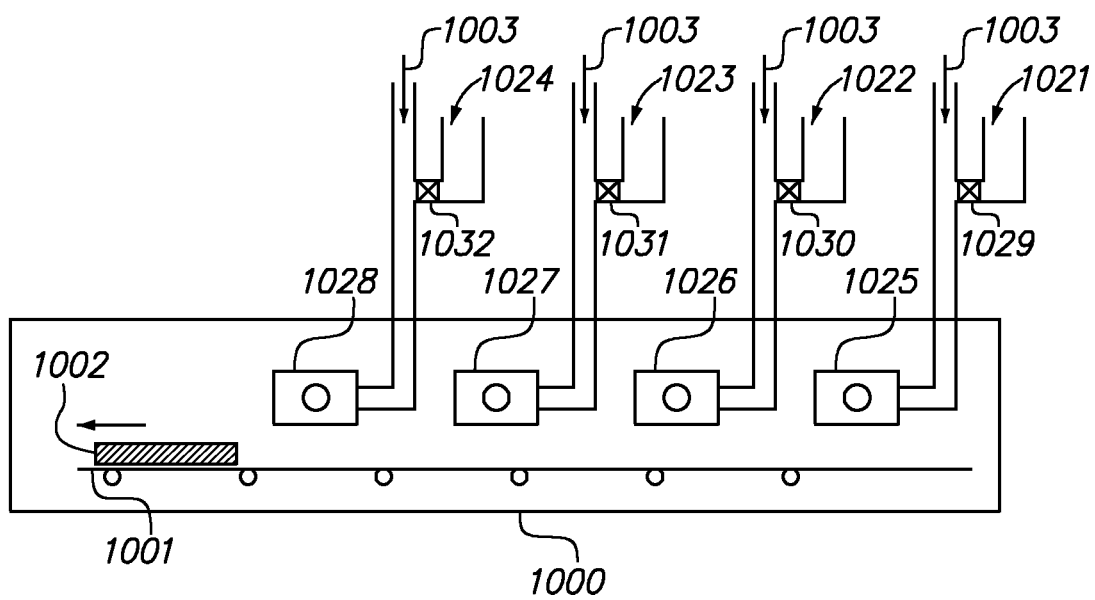
FIG. 17 is an apparatus for depositing CIGS thin films on a moving substrate. This Apparatus can be a roll-to-roll or batch tool or it can be a small lab tool.

Referring to FIG. 17, in one embodiment, the processing chamber 1000 now comprises four deposition stations and a conveyor belt 1001, which moves substrate structures 1002. CuGa and In powders, 1021 and 1023, respectively, can be used in two sources as depicted. The aforesaid procedure for depositing CIG, NaF and Se, depicted in FIG. 16, can be repeated for CuGa, NaF, In, and Se powders, 1021, 1022, 1023, and 1024, respectively, with four heating tubes, 1025, 1026, 1027, and 1028, respectively, and four control valves, 1029, 1030, 1031, and 1032, respectively, in four deposition stations.

Figure 18:
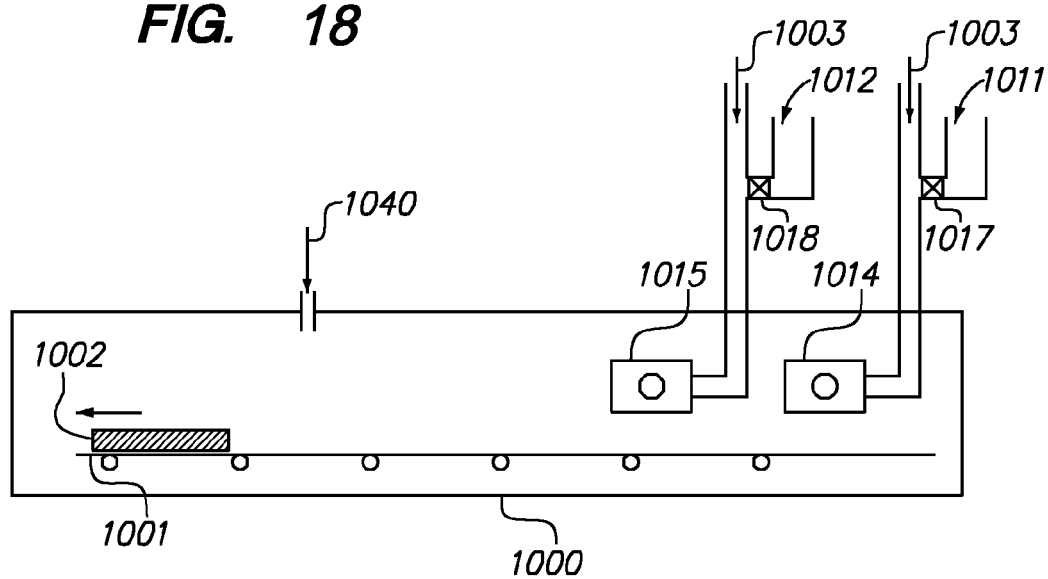
FIG. 18 is an apparatus for depositing CIGS thin films on a moving substrate. This Apparatus can be a roll-to-roll or batch tool or it can be a small lab tool.

Referring to FIG. 18, in one embodiment, the procedure is similar to the one depicted in FIG. 16, with similar processing chamber 1000, conveyor belt 1001, substrates 1002, and deposition stations for CIG and NaF, with one exception; Se is introduced through H2Se gas source 1040 directly onto the heated substrate for selenizing metallic precursors, deposited using CIG and NaF as depicted.

Figure 19:
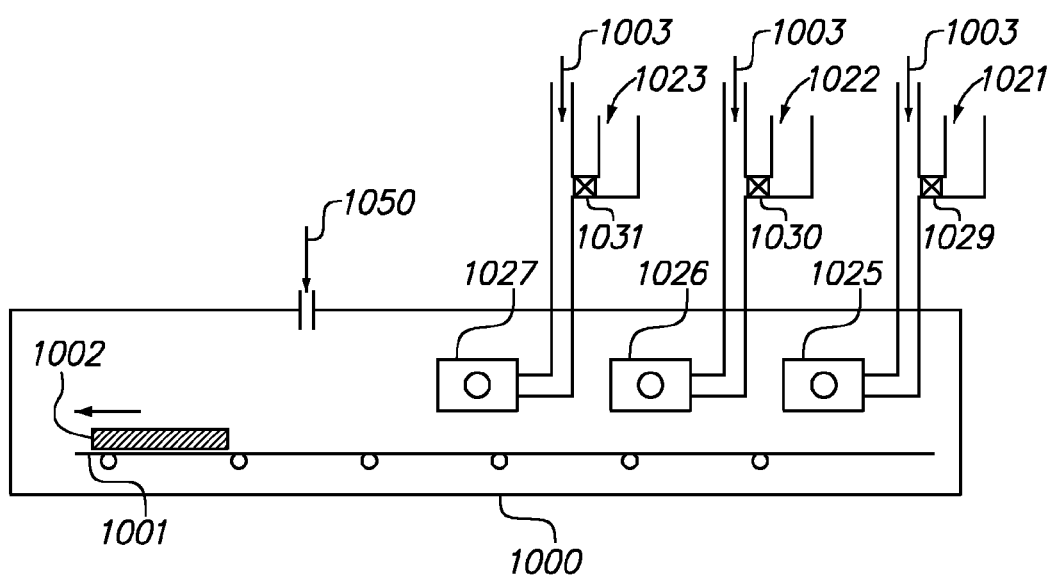
FIG. 19 is an apparatus for depositing CIGS thin films on a moving substrate. This Apparatus can be a roll-to-roll or batch tool or it can be a small lab tool.

Referring to FIG. 19, in one embodiment, the procedure is similar to the one depicted in FIG. 17, with similar processing chamber 1000, conveyor belt 1001, and substrates 1002, and deposition stations for CuGa, NaF, and In, with one exception; Se is introduced through H2Se gas source 1050 directly onto the heated substrate 1002 for selenizing metallic precursors, deposited using CuGa, NaF, and In as depicted. In another embodiment, SeF6 (Selenium hexafluoride) can be used instead of H2Se for selenizing (Cu,In,Ga) metals and their metallic alloys. This applies in all embodiments in this invention disclosure that use H2Se for selenizing the Cu, In and Ga precursor.

Moreover, it is appreciated by a person ordinarily skilled in the art that different combinations of materials can be used to form CIGS in an apparatus similar to the one depicted in FIGS. 16-19. For example, powders of (In,Ga)2Se3, CuxSe, CIGS, CGS, CIS, etc. can be used in any order that achieves the Cu/(In+Ga) and the Ga/(In+Ga) ratios of 0.7-1.0 and 0-1, respectively.

VI. Method 6

In this method, combinations of the above methods can be implemented to overcome certain limitations. Following are more details regarding some procedures to implement this method:

1. Cu is sputtered in one chamber kept at a reduced pressure of less than $1 \times 10^{-6}$ Torr, then In, Ga, and Se are co-evaporated in another chamber kept at a reduced pressure of less than $1 \times 10^{-6}$ Torr onto the Cu-coated substrate. Co-evaporation of group III elements (In and/or Ga), along with Se onto a substrate (metallic, glass or plastic) coated with sputtered Cu and sputtered Mo (Cu/Mo/(barrier layer)/glass) overcomes the compositional non-uniformity of In and/or Ga associated with depositing these group III elements at room temperature.

2. CuGa is sputtered in one chamber kept at a reduced pressure of less than $1\times10^{-6}$ Torr, then In and Se are co-evaporated in another chamber at CIGS crystallization temperature. Said second chamber is kept at a reduced pressure of less than $1\times10^{-6}$ Torr. Co-evaporation of In and Se onto a substrate (metallic, glass or plastic) coated with sputtered CuGa and sputtered Mo (CuGa/Mo/(barrier layer)/glass results in more compositional uniformity in CIGS film, as opposed to depositing In onto a substrate held at room temperature.
3. Cu is sputtered in one chamber kept at a reduced pressure of less than $1\times10^{-6}$ Torr, then In, Ga, and Se are deposited at CIGS crystallization temperature in another chamber using Vapor Transport Deposition (VTD). Pressure in said VTD chamber ranges from $1\times10{-6}$ Torr to atmospheric pressure.
4. CuGa is sputtered in one chamber kept at a reduced pressure of less than $1\times10^{-6}$ Torr, then In and Se are deposited at CIGS crystallization temperature in second chamber using Vapor Transport Deposition (VTD). Pressure in said second VTD chamber ranges from $1\times10{-6}$ Torr to atmospheric pressure.
5. CuInGa is sputtered in one chamber kept at a reduced pressure of less than $1\times10^{-6}$ Torr, then Se is evaporated at CIGS crystallization temperature in a second chamber. Pressure in said second chamber is reduced to less than $1\times10{-6}$ Torr.
6. CuInGa is sputtered in one chamber kept at a reduced pressure of less than $1\times10^{-6}$ Torr, then Se is deposited at CIGS crystallization temperature in another chamber using Vapor Transport Deposition (VTD); where the substrate is kept at CIGS crystallization temperature. The pressure in said VTD chamber ranges from $1\times10{-6}$ Torr to atmospheric.
7. Cu is sputtered in one chamber kept at a reduced pressure of less than $1\times10^{-6}$ Torr, In and Ga are deposited in a second chamber by using Vapor Transport Deposition using CuInGa powder material as the evaporation source material, where the source material evaporation temperature ranges from 100-900° C. and using elemental Se as the source for Se Vapor Transport Deposition. Pressure in said second VTD chamber ranges from $1\times10{-6}$ Torr to atmospheric.
8. Cu, In and Ga are deposited using thermal evaporation using CuInGa powder material as the evaporation source material in a first chamber kept at a reduced pressure of less than $1\times10^{-6}$ Torr, where the source material evaporation temperature ranges from 900-1500° C. and using thermal evaporation of elemental Se.
9. Cu is sputtered in one chamber kept at a reduced pressure of less than $1\times10^{-6}$ Torr, and In and Ga are deposited using a second chamber by Vapor Transport Deposition (VTD) of CuInGa powder material as the source material, where the source material evaporation temperature ranges from 100-900° C. and using elemental Se as the source material for Se Vapor Transport Deposition. Pressure in said second VTD chamber ranges from $1\times10{-6}$ Torr to atmospheric.
10. Cu, In and Ga are deposited using Vapor Transport Deposition of CuInGa powder material as the evaporation source material, where the source material evaporation temperature ranges from 900-1500° C. and using elemental Se as the source material for Se Vapor Transport Deposition.

Figure 22:
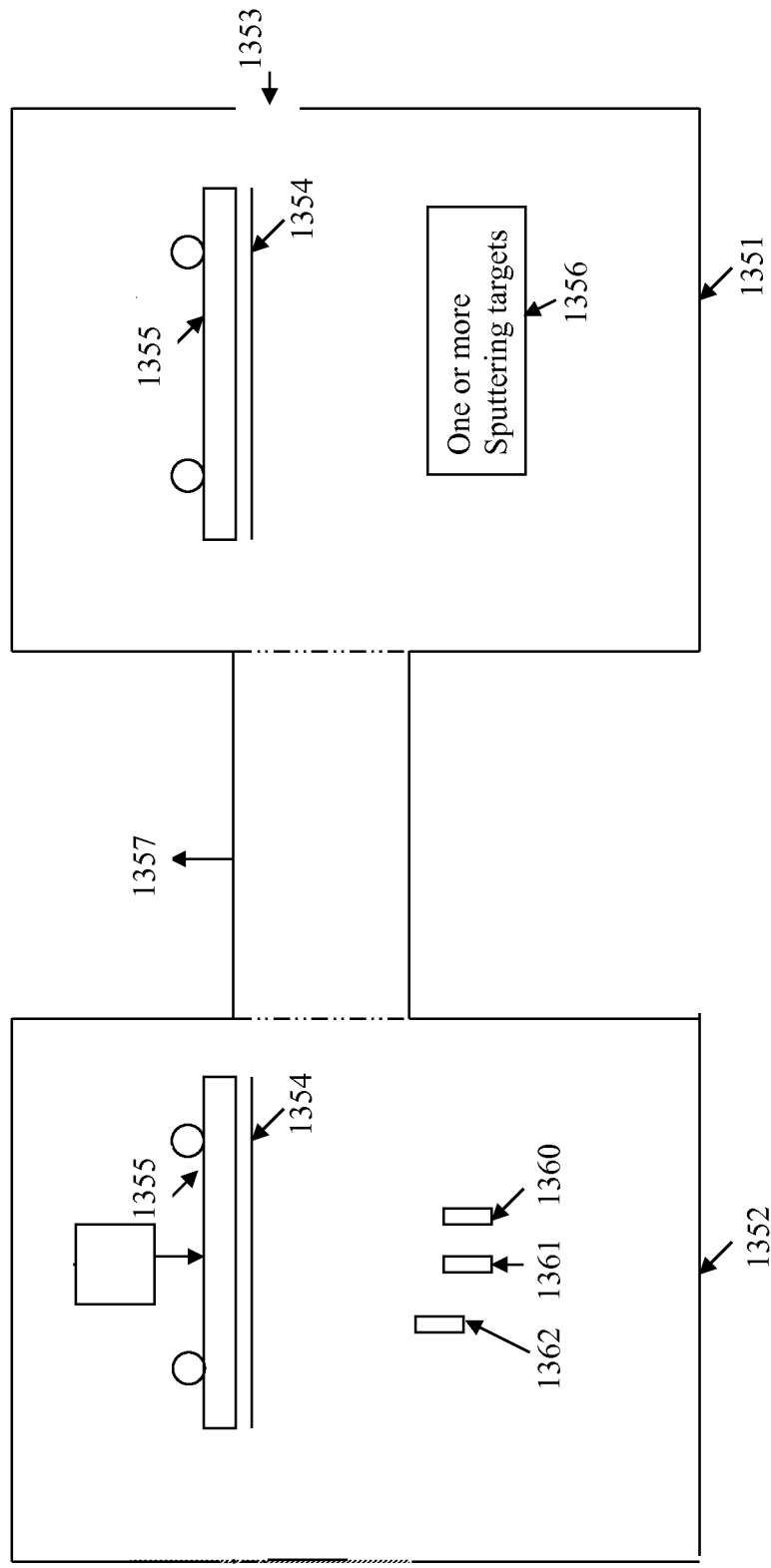
FIG. 22 is a schematic diagram illustrating one embodiment of method and system to deposit CIGS to a substrate.
Figure 23:
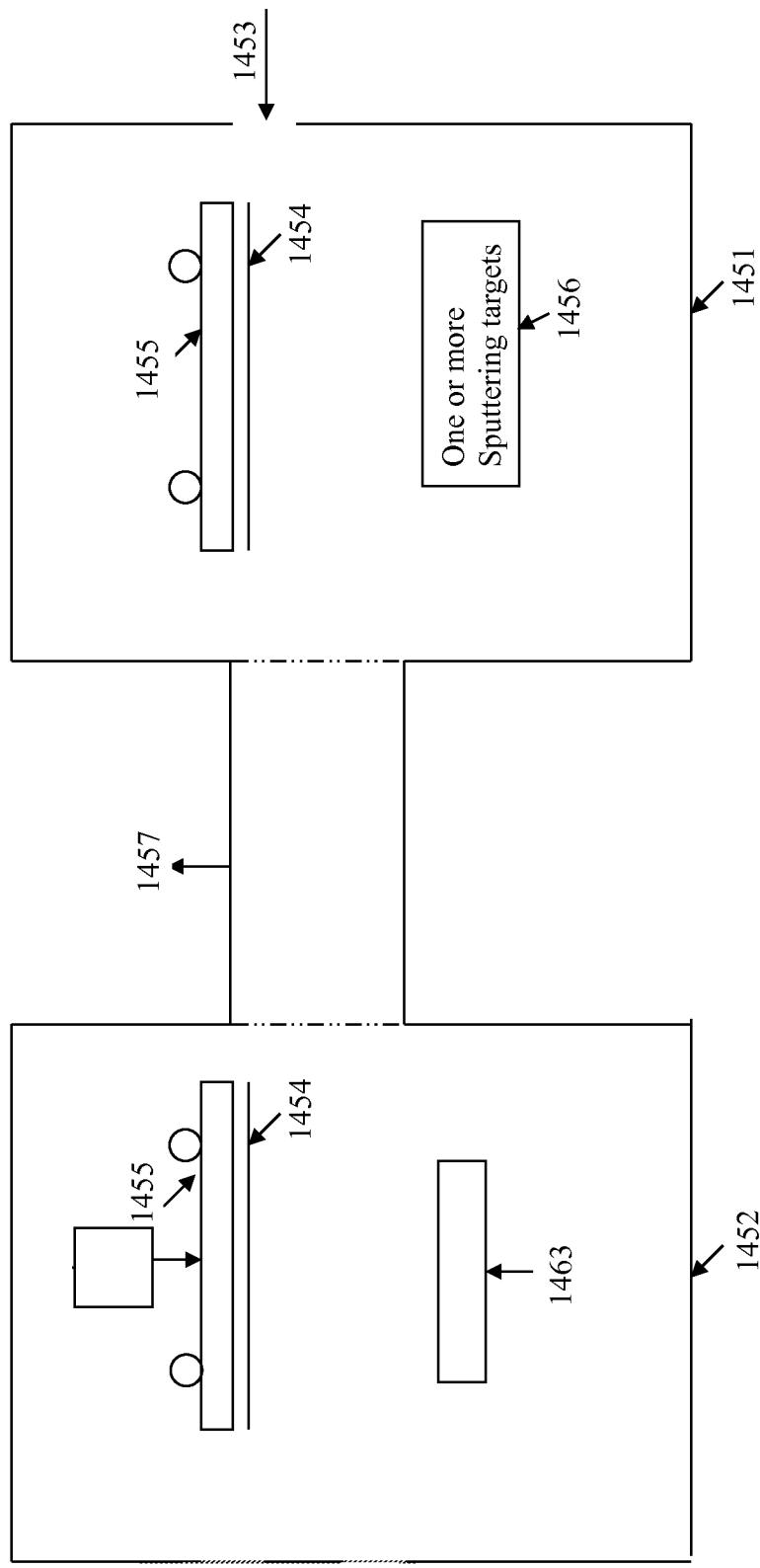
FIG. 23 is a schematic diagram illustrating another embodiment of method and system to deposit CIGS to a substrate.

Referring to FIG. 22, 1351 is a sputtering chamber kept at a reduced pressure of less than $1\times10^{-6}$ Torr, 1352 is a housing which houses thermal evaporation sources 1360, 1361 and 1362. In one aspect of the invention, 1360, 1361 and 1362 are In, Ga and Se, respectively. Cu is deposited in chamber 1351 using a Cu sputtering target 1356 onto the substrate 1354 comprised of 102/101/100 (FIG. 1) and loaded on a conveyor 1355. In one aspect of the invention, the substrate 1354 is held at room temperature. After depositing the targeted thickness of Cu in chamber 1351, the substrate is transferred into chamber 1352 using conveyor 1355 through load lock 1357. The Cu coated substrate 1354 is then heated using IR lamps, or resistive electrical heating or RF/Microwave heating to the CIGS crystallization temperature of greater than 400° C. and less than 800° C. Indium (In) 1360, Ga 1361 and Se 1362 are then co-evaporated in the second chamber onto the heated Cu-coated substrate to the targeted thicknesses to form Cu-poor CIGS chalcopyrite structure which has a Cu/(In+Ga) ratio of greater than 70% and less than 100% and Ga/(In+Ga) ratio greater than 0 and less than 100%. The CIGS coated substrate 1354 is then conveyed outside chamber 1352 for further processing. Said second chamber is kept at a reduced pressure of less than $1\times10^{-6}$ Torr, Referring to FIG. 23, 1451 is a sputtering chamber kept at a reduced pressure of less than $1\times10^{-6}$ Torr, 1452 is a housing which houses a Vapor transport Deposition (VTD) 1463, which is used to co-deposit thermal evaporation sources 1360, 1361 and 1362 in FIG. 22. In one aspect of the invention, 1360, 1361 and 1362 are In, Ga and Se, respectively. Cu is deposited in chamber 1451 using a Cu sputtering target 1456 onto the substrate 1454 comprised of 102/101/100 (FIG. 1) and loaded on a conveyor 1455. Said chamber 1451 is kept at a reduced pressure of $1\times10{-6}$ Torr. In one aspect of the invention, the substrate 1454 is held at room temperature. After depositing the targeted thickness of Cu in chamber 1451, the substrate is transferred into chamber 1452 using conveyor 1455 through load lock 1457. Chamber 1452 is kept at a reduced pressure of $1\times10{-6}$ Torr. The Cu coated substrate 1454 is then heated using IR lamps, or resistive electrical heating or RF/Microwave heating to the CIGS crystallization temperature of greater than 400° C. and less than 800° C. Indium (In) 1360, Ga 1361 and Se 1362 are then co-deposited using Vapor transport Deposition (VTD) 1463 onto the heated Cu-coated substrate to the targeted thicknesses to form Cu-poor CIGS chalcopyrite structure which has a Cu/(In+Ga) ratio of greater than 70% and less than 100% and Ga/(In+Ga) ratio greater than 0 and less than 100%. The CIGS coated substrate 1454 is then conveyed outside chamber 1452 for further processing.

In another aspect of the invention, CIG powder 1360 and Se 1362 can be thermally co-evaporated onto the Cu-coated substrate at temperatures ranging from 500-900° C. At these temperature, only In and Ga will be evaporated, despite the presence of Cu in the CIG powder as Cu needs higher temperature to vaporize it. This approach comprises a novel method to evaporate In and Ga together from one source (CIG powder in this case) which overcomes the need to use two sources; one for In and another one for Ga to evaporate In and Ga. This approach also comprises a novel method to deposit In and Ga from one source which is CIG powder as it is still a challenge to form stable In, Ga phases at room temperature.

In another aspect of the invention, CIG powder can be deposited onto the Cu-coated substrate at temperatures ranging from 500-900° C. using Vapor Transport Deposition 1463. At these temperature, only In and Ga will be evaporated, despite the presence of Cu in the CIG powder as Cu needs higher temperature to vaporize it. This approach comprises a novel method to evaporate In and Ga together from one source (CIG powder in this case) which overcomes the need to use two sources; one for In and another one for Ga to evaporate In and Ga. This approach also comprises a novel method to deposit In and Ga from one source which is CIG powder as it is still a challenge to form stable In, Ga phases at room temperature.

In another aspect of the invention, Na doping is introduced using elemental Na using thermal evaporation or Close Space Sublimation (CSS) and Vapor Transport Deposition.

VII. Method 7

Figure 20:
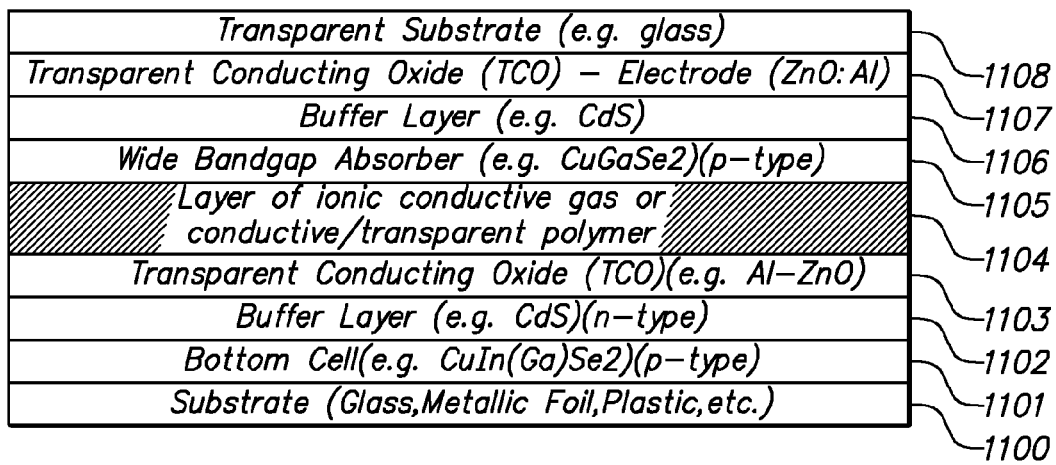
FIG. 20 is a schematic diagram illustrating a Superstrate/Substrate Tandem C(I)GS/CI(G)S solar cell, wherein two solar cells are coupled together in a tandem solar cell structure.

Another method to make CIGS based solar cells is to couple two junctions together in a tandem solar cell structure, where one solar cell with a low bandgap (<1 eV) and the other with a wide bandgap (greater than 1.7 eV) are combined. The wide bandgap solar cell is placed on top of the low bandgap solar cell. In this invention, a substrate solar cell with a low bandgap and a superstrate solar cell with a wide bandgap are used as the bottom and the top cells, respectively. Examples of the top cell are: CuGaSe2, a-Si, CuSeSe2, etc. Examples of the bottom cell are CuInSe2, c-Si, etc. Referring to FIG. 20, in one embodiment, a tandem solar cell comprises a substrate layer 1100, bottom cell layer 1101, buffer layer 1102, transparent conducting oxide layer 1103, ionic conductive gas or conductive/transparent polymer layer or Graphene 1104, wide bandgap absorber layer 1105, buffer layer 1106, transparent conducting oxide electrode layer 1107, and transparent substrate layer 1108. The substrate solar cell is built on a glass substrate or a metallic foil or a polyimide substrate 1100. The superstrate solar cell is built on a transparent substrate 1103 like TCO/glass. The wide bandgap material is grown on a transparent superstrate (e.g. TCO/glass). The substrate cell may be made on stainless steel, aluminum foil, glass, etc. In one embodiment, the substrate solar cell can be glued with the superstrate cell using conductive and transparent glue.

In one embodiment, a layer of ionic conductive gas 1104 can be used with the two sides fully sealed so that the ionic conductive layer doesn't leak out. In another embodiment, Graphene can be used to connect the top cell with the bottom cell.

Figure 21:
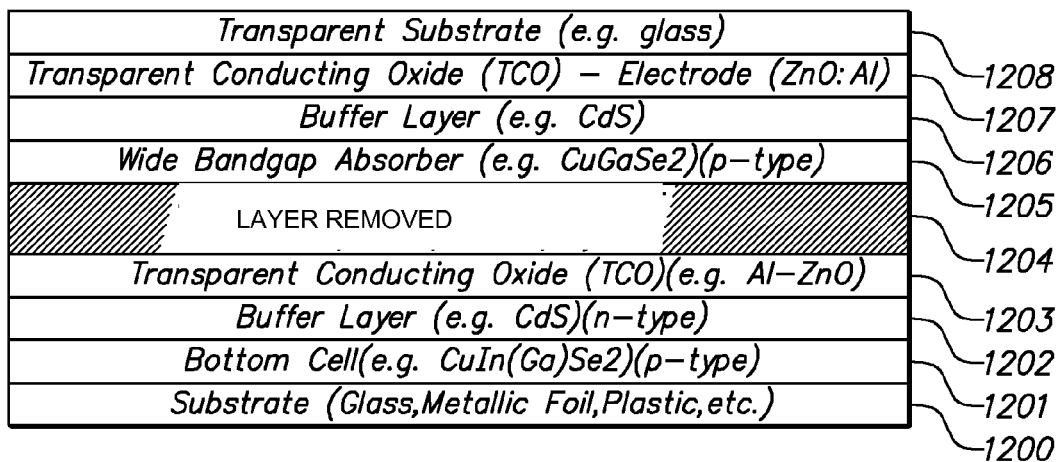
FIG. 21 is a schematic diagram illustrating a Monolithic Tandem C(I)GS/CI(G)S solar cell.

In another embodiment, a substrate solar cell with a low bandgap and a superstrate solar cell with a wide bandgap are used as the bottom and the top cells, respectively. Examples of the top cell are: CuGaSe2, a-Si, CuSeSe2, etc. Examples of the bottom cell are CuInSe2, c-Si, etc. Referring to FIG. 21, in one embodiment, a tandem solar cell comprises a substrate layer 1200, bottom cell layer 1201, buffer layer 1202, transparent conducting oxide layer 1203, a previous ionic conductive gas or conductive/transparent polymer layer or Graphene is now removed 1204, wide bandgap absorber layer 1205, buffer layer 1206, transparent conducting oxide electrode layer 1207, and transparent substrate layer 1208. The substrate solar cell is built on a glass substrate or a metallic foil or a polyimide substrate 1200. The superstrate solar cell is built on a transparent substrate 1203 like TCO/glass. The wide bandgap material is grown on a transparent superstrate (e.g. TCO/glass). The substrate cell may be made on stainless steel, aluminum foil, glass, etc. In one embodiment, the substrate solar cell can be glued with the superstrate cell using conductive and transparent glue.

In one embodiment, two substrate solar cells with the top cell having a wide bandgap and the bottom cell having a narrow bandgap, the structure of the tandem cell can be similar to [ZnO:Al(or ITO)/i-ZnO]/[CdS (or ZnS)]/[CGS]/[ZnO: Al (or ITO)/[i-ZnO]/[CdS (or ZnS)]/[CIS]/[(ITO or other TCO]/glass. Typical growth methods were not successful to grow a monolithically-integrated tandem solar cell where the CGS solar cell acts as the top cell and the CIS cell acts as the bottom cell because the bottom cell fails because of high temperature. This embodiment discloses making the top cell using the procedures described in Method 4 above. Once a CIS solar cell is made using any method as described above, then the {[ZnO:Al (or ITO)/i-ZnO]/[CdS(or ZnS)]/[CIS]/[(Mo]/[glass]} structure is placed under the HTDA shown in FIG. 3. Referring back to FIG. 4, CuGa powder can be placed in source material 1 and Se powder in source material 2. CG powder is then directed towards the heating tube for vaporization. The heating tube can be made of SiC and heated to a temperature capable of vaporizing CG powder. Once the CG powder is in the heating tube, then it vaporizes and mixes with the carrier gas until an optimal CG vapor/carrier ratio is reached. The Cu/Ga ratio in this case ranges from 0.8-1.0. The substrate can then be placed under the lower end of the permeable tube so that CG vapor can be streamed out to the bottom CIS cell as described above which is kept at the lowest temperature possible to avoid damaging the bottom junction. The bottom cell is also positioned on a moving substrate to minimize temperature effects. Se powder can then be introduced as described above and directed to the heating tube for vaporization. Se vapor/carrier gas mix will then be directed to be streamed out through the lower side of the permeable tube towards the CG/[bottom cell structure] in order to selenize the CG layer. The whole structure can then be taken out for completion of the top junction by depositing the buffer layer and TCO layer.

Still referring to FIG. 4, in one embodiment, the CGS layer can be deposited using CGS powder in source material 1. The CGS powder can then be directed using feeder tube to the heating tube which is heated to a temperature capable of vaporizing CGS. CGS vapor will then mix with the carrier gas until an optimal CGS vapor/carrier gas is achieved. The CGS vapor/carrier gas mix is directed towards the lower side of the distribution assembly to be streamed out towards the {[ZnO: Al (or ITO)/i-ZnO]/[CdS(or ZnS)]/[CIS]/[(Mo]/[glass]} structure (CIS bottom cell) which is heated to about 200-300° C. (preferably 250° C.). CGS vapor will condense on the CIS bottom because the temperature of the CIS bottom cell is lower than the temperature that is needed to keep the CGS in vapor phase. Given that CGS vapor needs a surface that is cooler to condense on it then a CGS film can form on the TCO surface of the CIS bottom cell. The whole structure can then be taken out for buffer layer and TCO deposition. This way a monolithic tandem structure can be made. In another embodiment, the formation of the top layer can be achieved in a short time that's longer than the time it takes to damage the junction because of high temperature. In yet another embodiment, the top cell is comprised of a-Si, which takes a lower temperature to form (e.g. 200° C.). No degradation will occur at this temperature.

The invention claimed is:
1. A method to deposit CIGS thin film for solar panel construction comprising:
  a. providing a first chamber;
  b. providing a substrate and placing said substrate inside said first chamber;
  c. providing a metallic target wherein said metallic target is made with elements and/or compounds selected from the group consisting of Cu, CuGa, In, CuIn and CuInGa;
  d. placing said metallic target inside said first chamber;
  e. reducing pressure within said first chamber to a pressure of less than $1 \times 10^{-6}$ Torr;
  f. adding sputtering gas into said first chamber after reducing pressure within said first chamber to a pressure of less than 1×10⁻⁶ Torr until said pressure in said chamber is increased to about 100 mTorr or less;
g. sputtering said elements and/or compounds from said metallic target to said substrate;
h. providing a second chamber;
i. transferring said substrate from said first chamber to said second chamber after said substrate is sputtered with said elements;
j. proving a Se vapor into said second chamber;
k. perform vapor deposition as to allow said Se to be deposited on said substrate.

2. The method of claim 1 wherein said substrate is first coated with a barrier layer.

3. The method of claim 2 wherein said barrier layer is made with elements selected from the group consisting of SiN, SiO2, SiC.

4. The method of claim 2 wherein said substrate is further coated with a back contact layer.

5. The method of claim 4 wherein said back contact layer is selected from one or more of the refractory elements group consisting of Mo, W, Nb, Ta and Rh.

6. The method of claim 1 wherein NaF can be deposited by evaporation onto said substrate before sputtering said elements from said metallic targets to said substrate.

7. The method of claim 1 wherein said step of sputtering said elements from said metallic target to said substrate is comprised of first sputtering CuGa from a CuGa target followed by sputtering In from In target wherein as a result the ration of Cu/(In+Ga) is between 0.7-1 and the ration of Ga/(In+Ga) is between 0-1.

8. The method of claim 1 wherein said step of sputtering said elements from said metallic targets to said substrate is comprised of first sputtering In from In target followed by sputtering CuGa from a CuGa target wherein as a result the ration of Cu/(In+Ga) is between 0.7-1 and the ration of Ga/(In+Ga) is between 0-1.

9. The method of claim 1 wherein said step of sputtering said elements from said metallic targets to said substrate is comprised of first sputtering CuGa from a CuGa target followed by sputtering CuIn from CuIn target wherein as a result the ration of Cu/(In+Ga) is between 0.7-1 and the ration of Ga/(In+Ga) is between 0-1.

10. The method of claim 1 wherein said step of sputtering said elements from said metallic targets to said substrate is comprised of first sputtering CuIn from CuIn target followed by sputtering CuGa from a CuGa target wherein as a result the ration of Cu/(In+Ga) is between 0.7-1 and the ration of Ga/(In+Ga) is between 0-1.

11. The method of claim 1 wherein said step of sputtering said elements from said metallic targets to said substrate is comprised of first sputtering CuGa from a CuGa target wherein ratio of Cu/Ga is greater than 1, followed by sputtering CuIn from CuIn target wherein ratio of Cu/In is less than 1, wherein as a result the ration of Cu/(In+Ga) is between 0.7-0.9 and the ration of Ga/(In+Ga) is between 0-1.

12. The method of claim 1 wherein said step of sputtering said elements from said metallic targets to said substrate is comprised of first sputtering CuIn from a CuIn target wherein ratio of Cu/In is less than 1, followed by sputtering CuGa from CuGa target wherein ratio of Cu/Ga is greater than 1, wherein as a result the ration of Cu/(In+Ga) is between 0.7-0.9 and the ration of Ga/(In+Ga) is between 0-1.

13. The method of claim 1 wherein said step of sputtering said elements from said metallic targets to said substrate is comprised of first sputtering CuGa from a CuGa target wherein ratio of Cu/Ga is less than 1, followed by sputtering CuIn from CuIn target wherein ratio of Cu/In is greater than 1, wherein as a result the ration of Cu/(In+Ga) is between 0.7-0.9 and the ration of Ga/(In+Ga) is between 0-1.

14. The method of claim 1 wherein said step of sputtering said elements from said metallic targets to said substrate is comprised of first sputtering CuIn from a CuIn target wherein ratio of Cu/In is greater than 1, followed by sputtering CuGa from CuGa target wherein ratio of Cu/Ga is less than 1, wherein as a result the ration of Cu/(In+Ga) is between 0.7-0.9 and the ration of Ga/(In+Ga) is between 0-1.

15. The method of claim 1 wherein said step of sputtering said elements from said metallic targets to said substrate is comprised of simultaneously sputtering CuIn from a CuIn target; and sputtering CuGa from CuGa target wherein as a result the ration of Cu/(In+Ga) is greater than 1 and the ration of Ga/(In+Ga) is between 0-1.

16. The method of claim 1 wherein said step of sputtering said elements from said metallic targets to said substrate is carried out in room temperature.

17. The method of claim 1 wherein said step of sputtering said elements from said metallic targets to said substrate wherein said substrate is heated to a temperature of less than 500° C.

18. The method of claim 17 wherein said substrate is heated by a method selected from the group consisting of Resistive/electrical heating, Infra-red (IR) heating, and RF heating/Microwave heating.

19. The method of claim 1 wherein said step of sputtering said element from said metallic target to said substrate is further comprising subjecting said substrate in planar motion as said elements are sputtered onto said substrate.

20. The method of claim 1 wherein said step of sputtering said elements from said metallic targets to said substrate is further comprising subjecting said substrate facing down as said elements are sputtered onto said substrate.

21. The method of claim 1 wherein said step of sputtering said elements from said metallic targets to said substrate is further comprising subjecting said substrate facing up as said elements are sputtered onto said substrate.

22. The method of claim 1 wherein said step of sputtering said elements from said metallic targets to said substrate is further comprising sputtering said elements from said metallic targets to said substrate until said elements on said substrate is approximately between 0.8-5 μm in thickness.

23. The method of claim 1 wherein a portion of Copper Sulfide (CuxS) is sputtered onto said substrate after said step of sputtering said elements from said metallic targets to said substrate.

24. A method to deposit CIGS thin film for solar panel construction comprising:
a. providing a first chamber and a second chamber;
b. providing a substrate and placing said substrate inside said first chamber;
c. providing a portion of Cu and sputtering said Cu on to said substrate to form a Cu substrate;
d. transporting said Cu substrate to said second chamber;
e. providing a thermal evaporation element in said second chamber wherein said thermal evaporation element is comprised of In, Ga and Se;
f. heating said thermal evaporation element and said Cu substrate in said second chamber whereby said thermal evaporation element evaporates and is deposited onto said Cu substrate to form a CIGS substrate.

25. The method of claim 24 further comprising the steps of reducing the pressure in said first chamber to less than 1×10⁻⁶ Torr and adding a sputtering gas to said first chamber before sputtering said Cu on to said substrate.

26. The method of claim 24 wherein said substrate is comprised of a barrier layer and a back contact layer.

27. The method of claim 24 wherein said the temperature of said first chamber is maintained at room temperature.

28. The method of claim 24 wherein said thermal evaporation element is comprised of a CIG powder.

29. A method to deposit CIGS thin film for solar panel construction comprising:
- a. providing a first chamber and a second chamber;
- b. providing a substrate and placing said substrate inside said first chamber;
- c. providing a portion of Cu and sputtering said Cu onto said substrate to form a Cu substrate;
- d. transporting said Cu substrate to said second chamber;
- e. providing a source material in said second chamber wherein said source material is introduced into said second chamber via a heating tube and distribution assembly;
- f. heating said source material through said heating tube and distribution assembly and converting said source material to a vaporized form;
- g. directing said source material to said Cu substrate via said heating tube and distribution assembly thereby depositing said source material on to said Cu substrate to form a CIGS substrate.

30. The method of claim 1 wherein said source material is comprised of In, Ga and Se.

31. The method of claim 1 wherein said source material is comprised of a portion of CIG powder.

* * * * *